(12) United States Patent
Barth et al.

(10) Patent No.: US 9,012,297 B2
(45) Date of Patent: Apr. 21, 2015

(54) METHODS OF FORMING MOISTURE BARRIER CAPACITORS IN SEMICONDUCTOR COMPONENTS

(75) Inventors: Hans-Joachim Barth, Munich (DE); Helmut Horst Tews, Munich (DE)

(73) Assignee: Infineon Technologies AG, Neubiberg (DE)

(*) Notice: Subject to any disclaimer, the term of this patent is extended or adjusted under 35 U.S.C. 154(b) by 1262 days.

(21) Appl. No.: 12/876,866

(22) Filed: Sep. 7, 2010

(65) Prior Publication Data

US 2010/0330771 A1    Dec. 30, 2010

Related U.S. Application Data

(62) Division of application No. 11/962,395, filed on Dec. 21, 2007, now Pat. No. 7,812,424.

(51) Int. Cl.
| | |
|---|---|
| H01L 21/441 | (2006.01) |
| H01L 27/08 | (2006.01) |
| H01L 23/522 | (2006.01) |
| H01L 23/00 | (2006.01) |
| H01L 23/58 | (2006.01) |
| H01L 27/06 | (2006.01) |

(52) U.S. Cl.
CPC ........ H01L 27/0805 (2013.01); H01L 23/5223 (2013.01); H01L 23/562 (2013.01); H01L 23/585 (2013.01); H01L 27/0611 (2013.01); H01L 2924/0002 (2013.01)

(58) Field of Classification Search
CPC ....................................................... H01L 28/40
USPC .................... 438/393; 257/E27.016, E27.017
See application file for complete search history.

(56) References Cited

U.S. PATENT DOCUMENTS

| | | |
|---|---|---|
| 5,789,302 A | 8/1998 | Mitwalsky et al. |
| 6,018,448 A | 1/2000 | Anthony |
| 6,025,639 A | 2/2000 | Mitwalsky et al. |
| 6,084,287 A | 7/2000 | Mitwalsky et al. |
| 6,261,945 B1 | 7/2001 | Nye, III et al. |
| 6,271,578 B1 | 8/2001 | Mitwalsky et al. |
| 6,383,893 B1 | 5/2002 | Begle et al. |
| 6,400,015 B1 | 6/2002 | Fraser et al. |
| 6,451,664 B1 | 9/2002 | Barth et al. |
| 6,709,954 B1 | 3/2004 | Werking |
| 6,734,090 B2 | 5/2004 | Agarwala et al. |
| 7,098,676 B2 | 8/2006 | Landers et al. |
| 2003/0032263 A1 | 2/2003 | Nagao et al. |
| 2004/0004241 A1 | 1/2004 | Aton |
| 2004/0075174 A1 | 4/2004 | Tamaru et al. |
| 2005/0026397 A1 | 2/2005 | Daubenspeck et al. |
| 2005/0110118 A1 | 5/2005 | Udupa et al. |
| 2005/0225333 A1 | 10/2005 | Talanov et al. |
| 2006/0145347 A1* | 7/2006 | Aida .............................. 257/758 |
| 2006/0220250 A1 | 10/2006 | Kim et al. |
| 2007/0102787 A1* | 5/2007 | Goebel et al. ................. 257/532 |
| 2007/0221613 A1 | 9/2007 | Gutsche et al. |

* cited by examiner

Primary Examiner — Jerome Jackson, Jr.
Assistant Examiner — Paul Budd
(74) Attorney, Agent, or Firm — Slater & Matsil, L.L.P.

(57) ABSTRACT

Structures and methods of forming moisture barrier capacitor on a semiconductor component are disclosed. The capacitor is located on the periphery of a semiconductor chip and includes an inner plate electrically connected to a voltage node, an outer plate with fins for electrically connecting to a different voltage node.

23 Claims, 22 Drawing Sheets

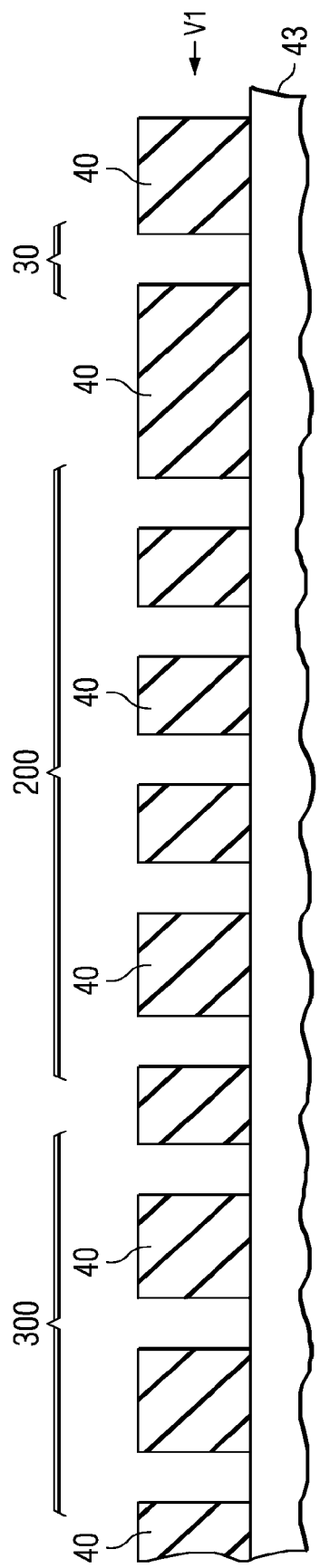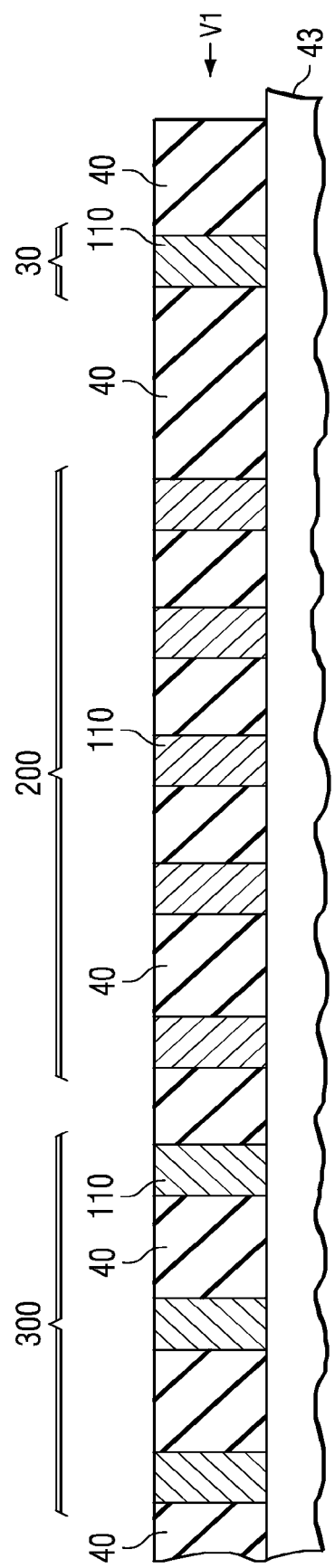

METHODS OF FORMING MOISTURE BARRIER CAPACITORS IN SEMICONDUCTOR COMPONENTS

This is a divisional application of U.S. application Ser. No. 11/962,395, entitled "Moisture Barrier Capacitors in Semiconductor Components," which was filed on Dec. 21, 2007, now U.S. Pat. No. 7,812,424 and is hereby incorporated herein by reference.

TECHNICAL FIELD

This invention relates generally to electronic devices, and more particularly to moisture barrier capacitors in semiconductor components.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a demand in semiconductor device technology to integrate many different functions on a single chip, e.g., manufacturing analog and digital circuitry on the same die. In such applications, large capacitors are extensively used for storing an electric charge. They are rather large in size, being several hundred micrometers wide depending on the capacitance, which is much larger than a transistor or memory cell. Consequently, such large capacitors occupy valuable silicon area increasing product cost. Such large capacitors are typically used as decoupling capacitors for microprocessor units (MPU's), RF capacitors in high frequency circuits, and filter and analog capacitors in mixed-signal products.

One of the goals in the fabrication of electronic components is to improve product speed. One way of improving product speed is by reducing interconnect parasitic capacitance. Hence, the semiconductor industry has increasingly adopted low-k materials. However, introduction of low-k materials introduces a number of reliability problems. For example, micro-cracks or nano-indents present on the edge of the chip after dicing can easily propagate through the low-k material layers and result in structural defects, delaminations or collapse. Similarly, moisture from the atmosphere may be absorbed into the active device region through the porous low-k material layers. This moisture can oxidize metallic materials present in the semiconductor chip as well as result in drift of product performance during operation. Hence, additional structures, taking up valueable chip area, are added to the chip to avoid these deleterious effects.

Thus, what are needed in the art are cost effective ways of forming semiconductor chips with increased functionality, good reliability, but without significant utilization of chip area.

SUMMARY OF THE INVENTION

These and other problems are generally solved or circumvented, and technical advantages are generally achieved, by embodiments of the present invention.

Embodiments of the invention include methods and structures for forming moisture barrier capacitors on an outer region of a semiconductor chip. In accordance with an embodiment of the present invention, the structure includes an outer and inner region, the outer region comprises an inner capacitor plate disposed adjacent the inner region, wherein the inner capacitor plate is electrically connected to a voltage node in the active circuitry. An outer capacitor plate is disposed between the inner capacitor plate and a dicing kerf, the outer capacitor plate comprises fins for electrically connecting the outer capacitor plate to the active circuitry, and vias and metal lines for capacitively coupling to the inner capacitor plate.

The foregoing has outlined rather broadly the features of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1a-1d, illustrates an embodiment of a chip with a moisture barrier capacitor, wherein FIG. 1a illustrates a top view of the chip illustrating the capacitor, FIG. 1b illustrates a magnified top view of a portion of the capacitor illustrated in FIG. 1a, and FIGS. 1c and 1d illustrate cross sections of a portion of the capacitor illustrated in FIG. 1a;

FIG. 2, which includes FIGS. 2a and 2b, illustrates the use of a moisture barrier capacitor in accordance with embodiments of the present invention, wherein FIG. 2a illustrates a cross section of the moisture barrier capacitor after accelerated testing or operation and FIG. 2b illustrates a change in capacitance after accelerated testing or operation relative to a change in measure of oxidation of the capacitor plates;

FIG. 3, which includes

FIG. 6, which includes

FIG. 7, which includes FIGS. 7a-7g, illustrates a method of fabrication of the moisture barrier capacitor in various stages of fabrication, in accordance with embodiments of the invention;

FIG. 8, which includes

FIG. 9, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
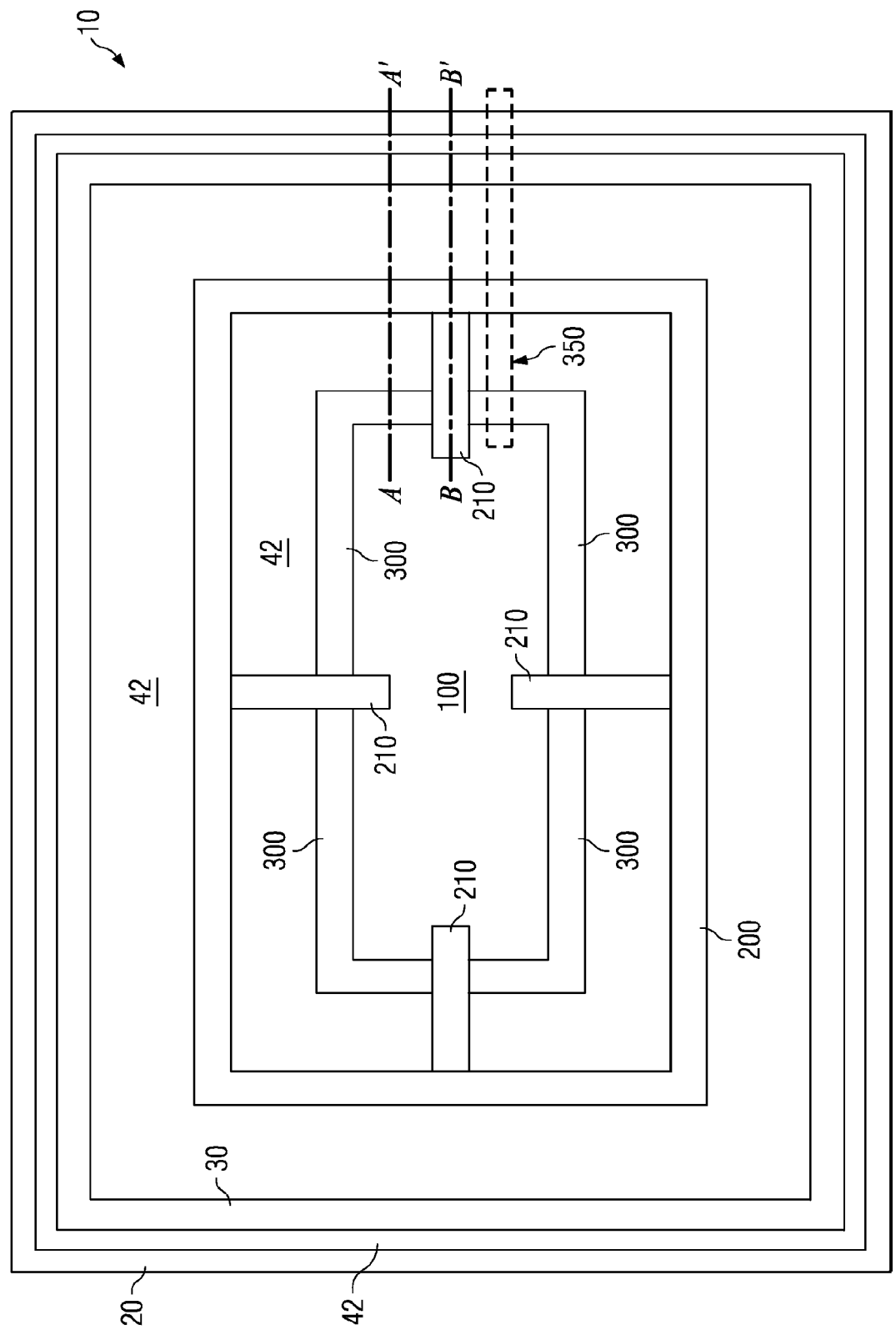

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a structure and method for forming a moisture barrier capacitor. In various embodiments, the invention avoids the use of additional mask steps in forming a capacitor on the periphery of a chip. The peripheral capacitor also includes a moisture barrier layer for preventing moisture diffusing into the active regions of the chip. In various embodiments, the invention integrates multiple functionalities into a single structure. Hence, the moisture barrier capacitor may be used in a number of semiconductor components. Examples of such components include system on chip (SoC), microprocessor units (MPU's), high frequency circuits, and mixed-signal products.

Large capacitors such as metal-insulator-metal (MIM) capacitors are planar capacitors and typically comprise two metal plates sandwiched around a capacitor dielectric that is parallel to a semiconductor wafer surface. The capacitor is formed by a masking and patterning step and introduces process complexity and cost. For example, the top capacitor metal plate is formed by a planar deposition of a conductive material, and lithographically patterning and etching the conductive material using a reactive ion etch (RIE) process. In various embodiments of the current invention, the present invention overcomes the cost limitations of forming large capacitors by using parasitic structures. Parasitic structures do not use additional mask or process steps and are formed naturally during the fabrication process.

Moisture in the environment can diffuse into the active device regions through the dense or porous low-k material layers. The diffused moisture can attack both interconnects causing increased resistance or collapse in extreme cases. The diffused moisture may also introduce mobile charge (such as Na) into the gate oxide resulting in changes in device electrostatics and hence product behavior. One way of solving this problem involves formation of a continuous metallic layer that forms a wall or barrier to the penetration of moisture. In practice, two continuous layers of moisture barrier are formed on the periphery of the chip. However, this consumes precious real estate area on the chip without forming a functional part of the circuitry.

In various embodiments, the present invention overcomes these limitations by combining the functionality of a moisture barrier layer and a capacitor. A single structure is used for both these functions, and hence reduces the area consumed. Further, in various embodiments, the invention achieves this without additional mask or process steps.

A structural embodiment of the invention will be first described using FIG. 1. The chip functionality during the life of the product and a chip cross section near or after end of life is illustrated in FIG. 2. Various structural embodiments will then be described using FIGS. 3-6 and 10. Embodiments of the methods of fabrication will be described using FIGS. 7 and 9 and the flow charts of FIG. 8.

Figure 1B:
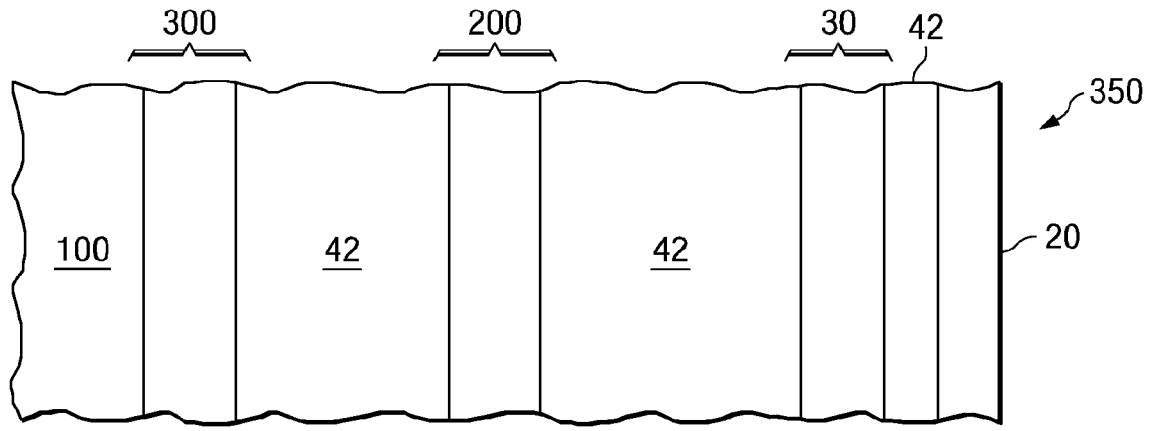
Figure 1C:
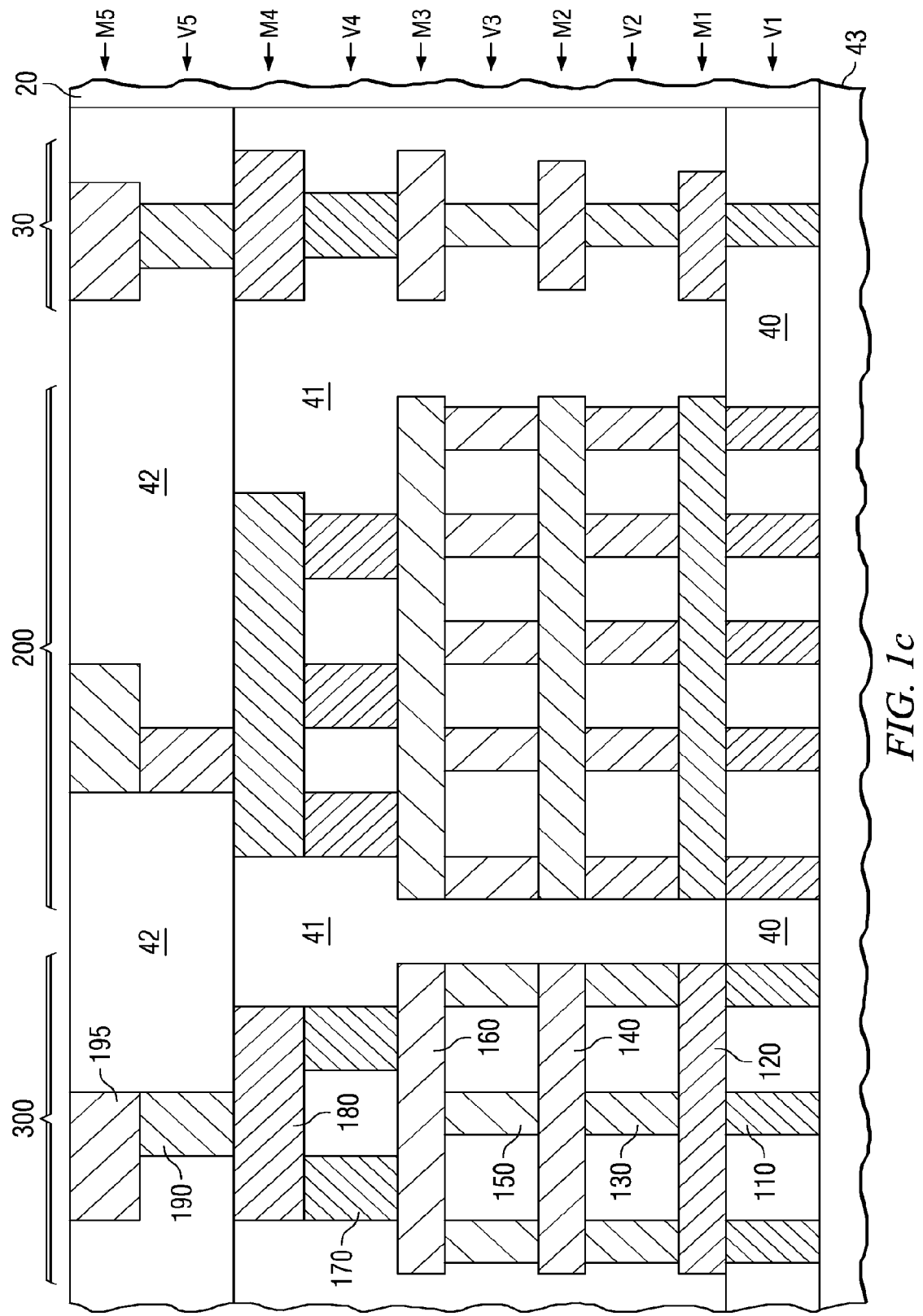
Figure 1D:
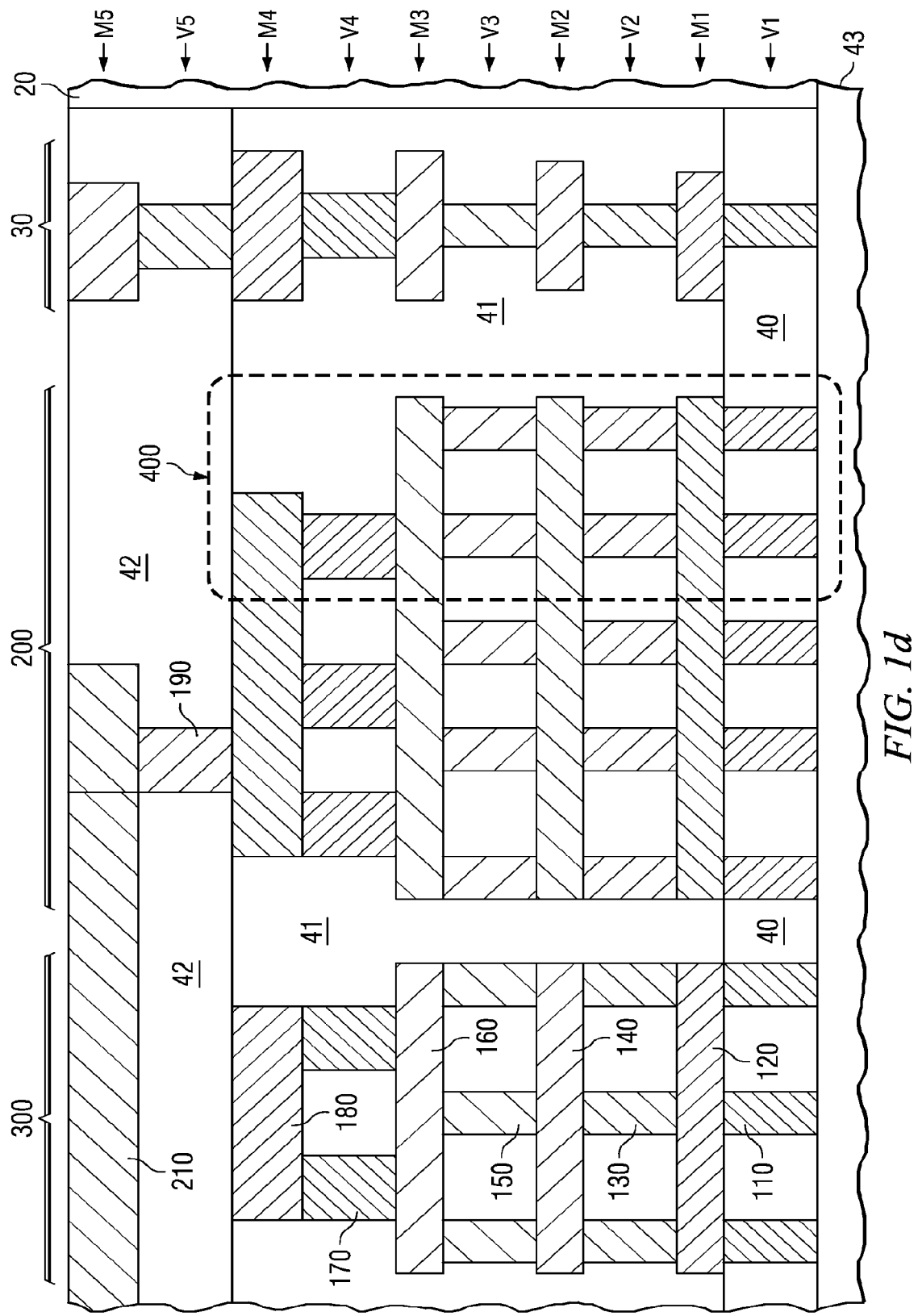

An embodiment of the invention is illustrated in FIG. 1 which includes FIG. 1a-1d. FIG. 1a illustrates a top view of a chip, FIG. 1b illustrates a magnified top view of the chip illustrated in FIG. 1a, FIG. 1c illustrates a cross section of a portion of the chip illustrated in FIG. 1a by AA', and FIG. 1d illustrates a cross section of a portion of the chip illustrated in FIG. 1a by BB'.

FIG. 1a illustrates a top cross sectional view of the chip 10, the chip 10 (not shown to scale) contains active circuitry 100 disposed inside it. The active circuitry 100 contains the active device regions and includes necessary transistors, resistors, capacitors, inductors or other components used to form integrated circuits. For example, active areas that include transistors (e.g., CMOS transistors) can be separated from one another by isolation regions, e.g., shallow trench isolation.

Next, metallization is formed over the active device regions to electrically contact and interconnect the active devices. The metallization and active device regions together form a completed functional integrated circuit. In other words, the electrical functions of the chip 10 can be performed by the interconnected active circuitry 100. In logic devices, the metallization may include many layers, e.g., nine or more, of copper or alternatively of other metals. In memory devices, such as DRAMs, the number of metal levels may be less and may be aluminum.

A magnified top view of the chip 10 is illustrated in FIG. 1b (region 350 of FIG. 1a). As illustrated in FIG. 1a and FIG. 1b, the chip 10 is surrounded by a kerf 20 used during dicing the chip from the wafer or substrate. The periphery of the chip 10 further comprises an optional crack stop 30 adjacent to the kerf 20 or dicing channel. The periphery of the chip 10 further comprises an outer capacitor plate 200 surrounding an inner capacitor plate 300. The outer capacitor plate 200, the inner capacitor plate 300, and the optional crack stop 30 are embedded in a first insulating layer 40. The outer capacitor plate 200 is connected to the active circuitry 100 by fins 210. In some embodiments, the outer capacitor plate 200 may incorporate the features of the optional crack stop 30, thus avoiding formation of a separate optional crack stop 30. The outer capacitor plate 200 and the inner capacitor plate 300 comprise metal lines and vias disposed in multiple metal and via levels. In various embodiments of the invention, these metal lines and the vias are designed and built preferably as uninterrupted metal filled lines or trenches all around the circumference of the chip. Further, the metal lines and the vias are also uninterrupted, vertically forming a wall or barrier to moisture penetration. Consequently, these uninterrupted metal and via lines of the outer capacitor plate 200 and the inner capacitor plate 300 form a continuous wall or barrier both along the periphery of the chip as well as vertically in the interconnect regions. Thus, the outer capacitor plate 200 and the inner capacitor plate 300 form a barrier to moisture penetration. In some embodiments, only the metal lines and the vias disposed in the outer capacitor plate 200 and proximate to the optional crack stop 30 or the kerf 20 form a continuous wall or barrier.

Vertical cross sections of a portion of the chip 10 (line AA' in FIG. 1a) are illustrated in FIGS. 1c and 1d (line BB' in FIG. 1a). As illustrated, the edge of the chip comprises the dicing kerf 20. The chip cross section illustrates the various levels of metallization. The five metal levels comprising $M_1$, $M_2$, $M_3$, $M_4$, and $M_5$ are stacked vertically and connected by contact and via levels $V_1$, $V_2$, $V_3$, $V_4$, and $V_5$. In other embodiments, more or less number of metal and via levels may be used.

The optional crack stop 30, outer capacitor plate 200 and inner capacitor plate 300 are embedded in a first insulation layer 40, a second insulation layer 41 and a third insulation layer 42 on a substrate 43. The outer capacitor plate 200 and inner capacitor plate 300 form a parasitic capacitor on the periphery of the chip. The outer capacitor plate 200 comprises an additional structure forming a moisture barrier 400. The structures optional crack stop 30, outer capacitor plate 200, and inner capacitor plate 300 are formed from the metal levels $M_1$, $M_2$, $M_3$, $M_4$, and $M_5$ and connected by contact and via levels $V_1$, $V_2$, $V_3$, $V_4$, and $V_5$. In some embodiments the outer capacitor plate 200 comprising the moisture barrier structure may also function in addition as a crack stop 30. In those embodiments the optional crack stop 30 can be omitted.

The first contacts or vias 110 from the first via level $V_1$ comprising a plurality of vias of different designs are disposed above the substrate 43. The first vias 110 are embedded in a first insulating layer 40, the first insulating layer 40 disposed over the substrate 43. The substrate 43 is a wafer or an oxide layer over the wafer.

The first insulating layer 40 preferably comprises $SiO_2$ such as tetra ethyl oxysilane (TEOS) or fluorinated TEOS (FTEOS), but in various embodiments may comprise insulating materials typically used in semiconductor manufacturing for inter-level dielectric (ILD) layers, such as doped glass (BPSG, PSG, BSG), organo silicate glass (OSG), carbon doped oxides (CDO), fluorinated silicate glass (FSG), spin-on glass (SOG), or low-k insulating materials, e.g., having a dielectric constant of about 4 or less, or dielectric diffusion barrier layers or etchstop layers such as silicon nitride (SiN), silicon oxynitride (SiON), silicon carbide (SiC) or silicon carbo nitride (SiCN), e.g., having a dielectric constant of about 4 or higher or combinations or multiple layers thereof, as examples, although alternatively, the insulating material layer 40 may comprise other materials. The ILD may also comprise dense SiCOH or a porous dielectric having a k value of about 3 or lower, as examples. The ILD may also comprise an ultra-low-k (ULK) material having a k value of about 2.3 or lower, for example. The ILD may comprise a thickness of about 500 nm or less, for example, although alternatively, the ILD may comprise other dimensions.

The pitch (distance between individual vias) of the first contacts or vias 110 is controlled by the minimum allowed spacing defined for the particular technology. To maximize capacitive coupling, the pitch between the first vias 110 (as well as other via and metal levels) is at this minimum allowed spacing. The first vias 110 comprise an outer first conductive liner and core comprising a first conductive material. The first conductive liner comprises, for example, CVD titanium nitride and silicon doped tungsten, although in other embodiments, the first conductive liner may comprise other materials such as tantalum, tantalum nitride, titanium, tungsten nitride, ruthenium or any combinations thereof. The first conductive material comprises tungsten, although in other embodiments, the first conductive material may comprise other suitable materials such as copper, aluminum, tungsten, tantalum, titanium nitride, and ruthenium.

A second insulation layer 41 is disposed above the first insulation layer 40. An optional etch stop liner is present between the first and second insulation layers 40 and 41 (not shown). The second insulation layer 41 preferably comprises a low-k dielectric for minimizing delay arising from parasitic capacitances between vias or metal lines. The second insulation layer 41 comprises a material selected from the group comprising fluorinated silicate glass (FSG), carbon doped glass (such as Black Diamond™, Coral™, Aurora™), organo silicate glass (OSG), hydrogen doped glass, porous carbon doped glass, porous silicon dioxide, polymeric dielectrics (e.g., FLARE™, SILK™), F-doped amorphous carbon, silicone based polymeric dielectrics such as hydrogen silsesquioxane (HSQ) and methylsilsesquioxane (MSQ) as well as other ultra low-k materials such as porous silicate glass, xerogel, aerogel, nano clustered silica (NCS), porous organo silicate glass, porous organics. The second insulation layer 41 may either be spin-on material or deposited by techniques such as CVD. The second insulation layer 41 may additionally comprise individual layers for each metal level, the individual layers in each metal level or via level separated by etch stop liners and dielectric diffusion barriers to cap the metal lines such as silicon nitride (SiN), silicon carbide (SiC), silicon carbo nitrides (SiCN) or other suitable dielectric barrier layers or combinations thereof The first metal level $M_1$ comprising the first metal line 120 is disposed above first contacts and vias 110 and embedded in the second insulating layer 41. The inner core of first metal line 120 comprises a second conductive material and an outer second conductive liner to minimize out diffusion of the second conductive material during subsequent thermal processing. The second conductive material comprises copper although some embodiments may comprise aluminum, tungsten, silver, gold, or other conductive materials. The outer second conductive liner comprises a diffusion barrier metal such as titanium nitride, titanium, tantalum, tantalum nitride, tungsten nitride, tungsten carbo nitride (WCN), ruthenium or other suitable conductive nitrides or oxides.

Second vias 130 are disposed above the first metal line 120. The second vias 130 comprise a copper core with an outer liner preferably of tantalum nitride and tantalum, although in some embodiments the second vias 130 comprise tungsten and outer liners of titanium and titanium nitride or other metal liners or liner combinations.

As illustrated, further metal levels comprising second metal line 140, third metal line 160, and fourth metal line 180 are disposed in the second insulating layer 41. Third vias 150 connect the second metal lines 140 with the third metal lines 160. Similarly, fourth vias 170 connects the third and fourth metal lines 160 and 180.

A third insulating layer 42 is disposed above the second insulating layer 41. The third insulating layer 42 comprises a silicon dioxide layer or other less porous material. Fifth vias 190 and fifth metal line 180 are embedded in the third insulating layer 42. The third insulating layer 42 is covered by a passivation layer (not shown).

The third insulating layer 42 comprising silicon dioxide layer is impervious to diffusion or transport of moisture through it. Hence, breaks or discontinuities in the metal lines are possible in this layer without degrading the reliability of the chip 10. However, the second insulating layer 41 is porous and cannot provide sufficient barrier to moisture transport. Hence, the stack of metal lines (for example, $M_1$ to $M_4$ and $V_2$ to $V_4$) is continuous to avoid penetration of moisture through the porous second insulating layer 41.

In the capacitor plates the contacts or vias $V_1$, $V_2$, $V_3$, $V_4$ and $V_5$ are designed preferably as uninterrupted lines or trenches in the minimum dimensions of the respective via level. However, other design variants, like arrays of rectangular, square or circular or elongated vias, may also be used at least in parts of the capacitor structure or parts of the moisture oxidation barrier structure. The via structures mentioned above may alternatively use larger dimensions than the minimum dimensions of the respective levels.

As illustrated in FIGS. 1a and 1d, the outer capacitor plate 200 is continuous and prevents moisture penetrating into the active circuitry 100 of the chip. However, as illustrated in FIG. 1d, the inner capacitor plate 300 has discontinuities or breaks. These breaks are in regions where the fins 210 electrically connect the active circuitry 100 to the outer capacitor plate 200. The inner capacitor plate 300 is connected to the active circuitry 100 via the lower metal levels ($M_1$ to $M_4$). Alternatively the inner capacitor plate 300 can also be connected via the top most metal level in areas outside of the break areas used for the fins 210 connecting the outer capacitor plate 200.

The moisture barrier capacitor is operated, for example, by grounding the outer capacitor plate 200 via the fins 210, and connecting the inner capacitor plate 300 to a given positive or negative voltage.

Figure 2B:
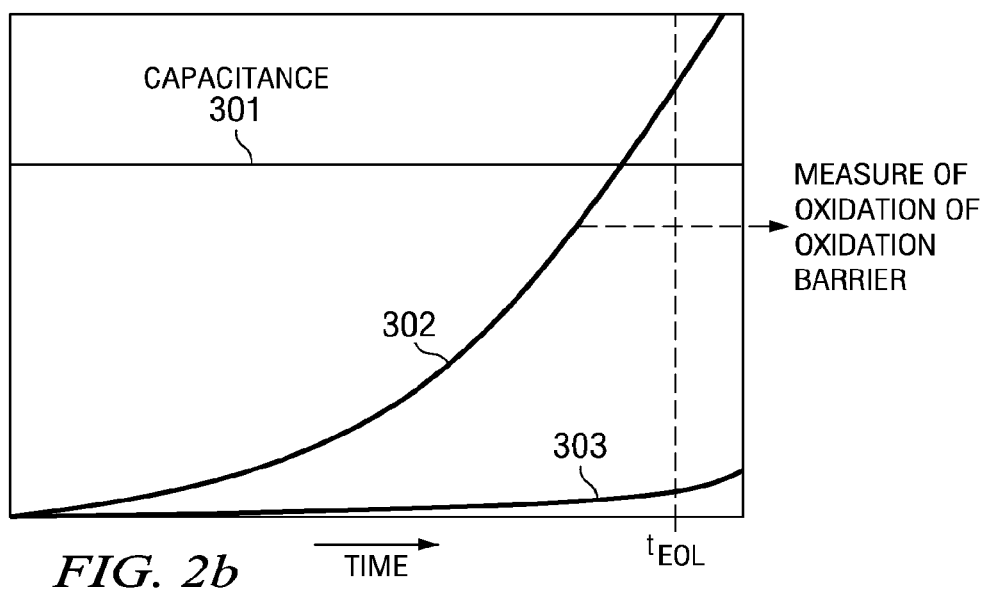
Figure 2A:
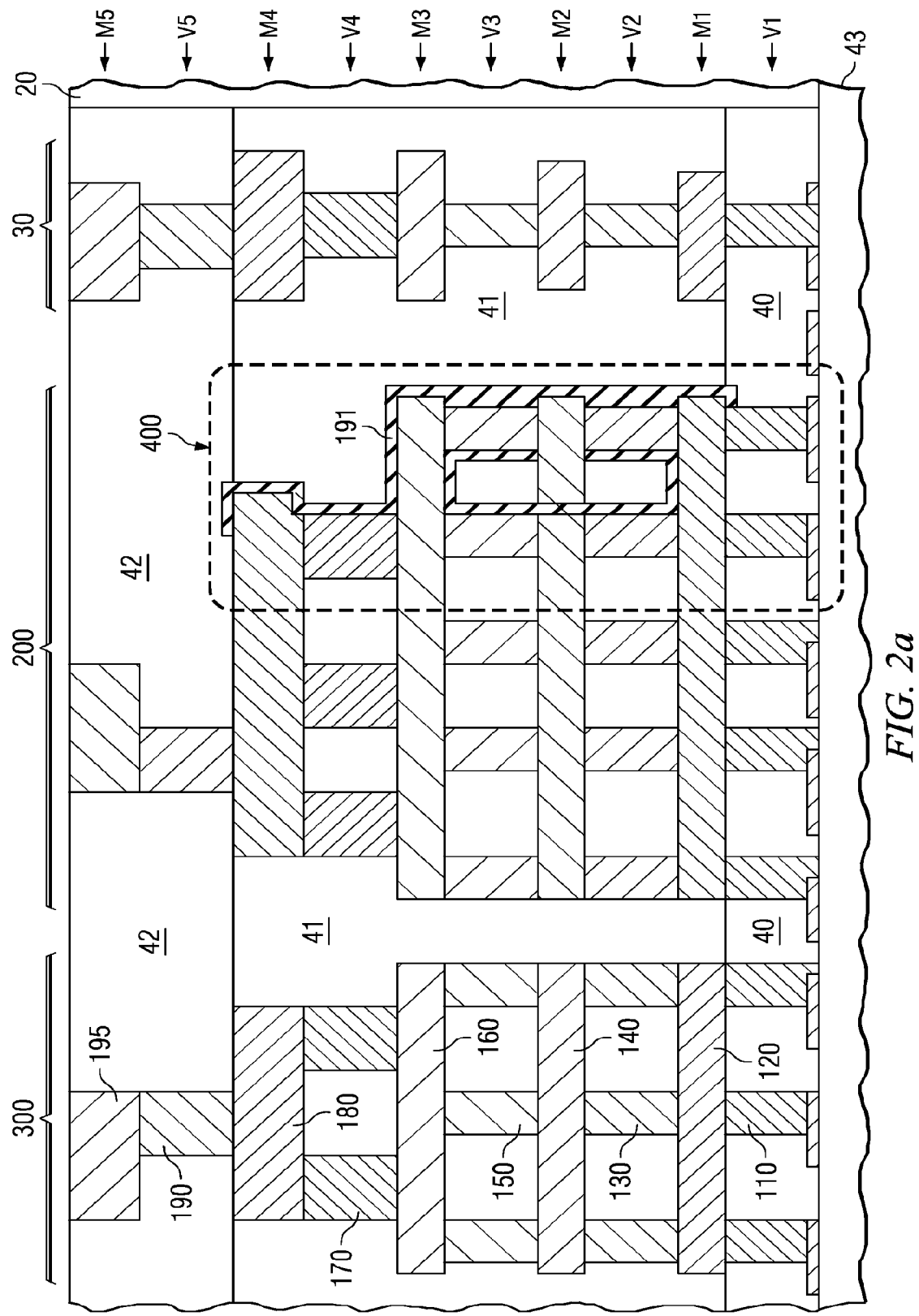

An embodiment describing the use of the moisture barrier capacitor is now discussed using FIGS. 2a and 2b.

Referring to FIG. 2a, the outer capacitor plate 200 comprises a moisture barrier 400. The moisture barrier 400 comprises additional vias and additional area of metal lines added as a sacrificial layer. In various embodiments of the invention, the moisture barrier 400 comprises uninterrupted metal lines and vias all around the circumference of the chip. Further, the metal lines and the vias of the moisture barrier 400 are also uninterrupted vertically forming a wall or barrier to moisture penetration. During the course of operating the product, the moisture barrier 400 oxidizes and captures any moisture around it. Further, a portion of the sacrificial metal lines and vias of the moisture barrier 400 may be partly or wholly consumed by oxidation due to formation of a metal oxide. For example, in FIG. 2a, the outer regions of the outer capacitor plate 200 are consumed relative to the inside regions of the outer capacitor plate 200.

The end of life of a product under normal operation is typically determined from accelerated tests. Such accelerated tests may be performed to test the functionality of the moisture barrier capacitor. Under such accelerated tests, the chip undergoes testing at intense conditions. For example, high level of humidity, high stress voltage, higher temperatures are used to test chip functionality over a period of time. Under normal operation, a chip is expected to behave similarly to accelerated tests but over a longer period of time.

During such a test, the outer exposed side of the moisture barrier 400 oxidizes, forming a metal oxide layer 191. Hence, a measure of oxidation (curve 302) e.g., thickness of the metal oxide layer 191 from TEM, SEM measurements, increases with time of the test. The outer capacitor plate 200 and the moisture barrier 400 may be redesigned to minimize oxide formation in regions beyond the moisture barrier 400. For example, FIG. 2b illustrates a moisture barrier 400 after such a redesign, and hence curve 303 from an inner region of the moisture barrier 400 illustrates negligible change in thickness of the metal oxide layer 191.

In various embodiments, the moisture barrier 400 is designed to not contribute to the capacitance of the capacitor. Thus, as illustrated in FIG. 2b, the capacitance of the parasitic capacitor (curve 301) does not change during the life of operation of the product.

FIG. 3 illustrates magnified top cross sections (e.g., region 350 of FIG. 1a), in accordance with embodiments of the moisture barrier capacitor.

Figure 3A:
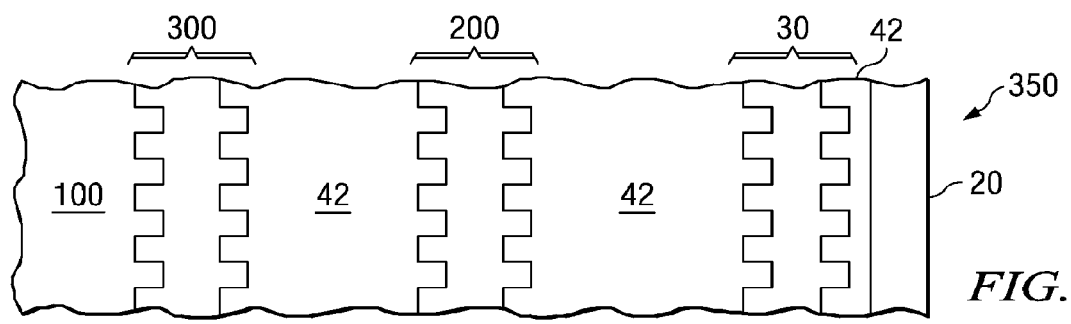
FIGS. 3a and 3b, illustrates a magnified top view of the moisture barrier capacitor illustrated in FIG. 1a, in various embodiments of the invention.
Figure 3B:
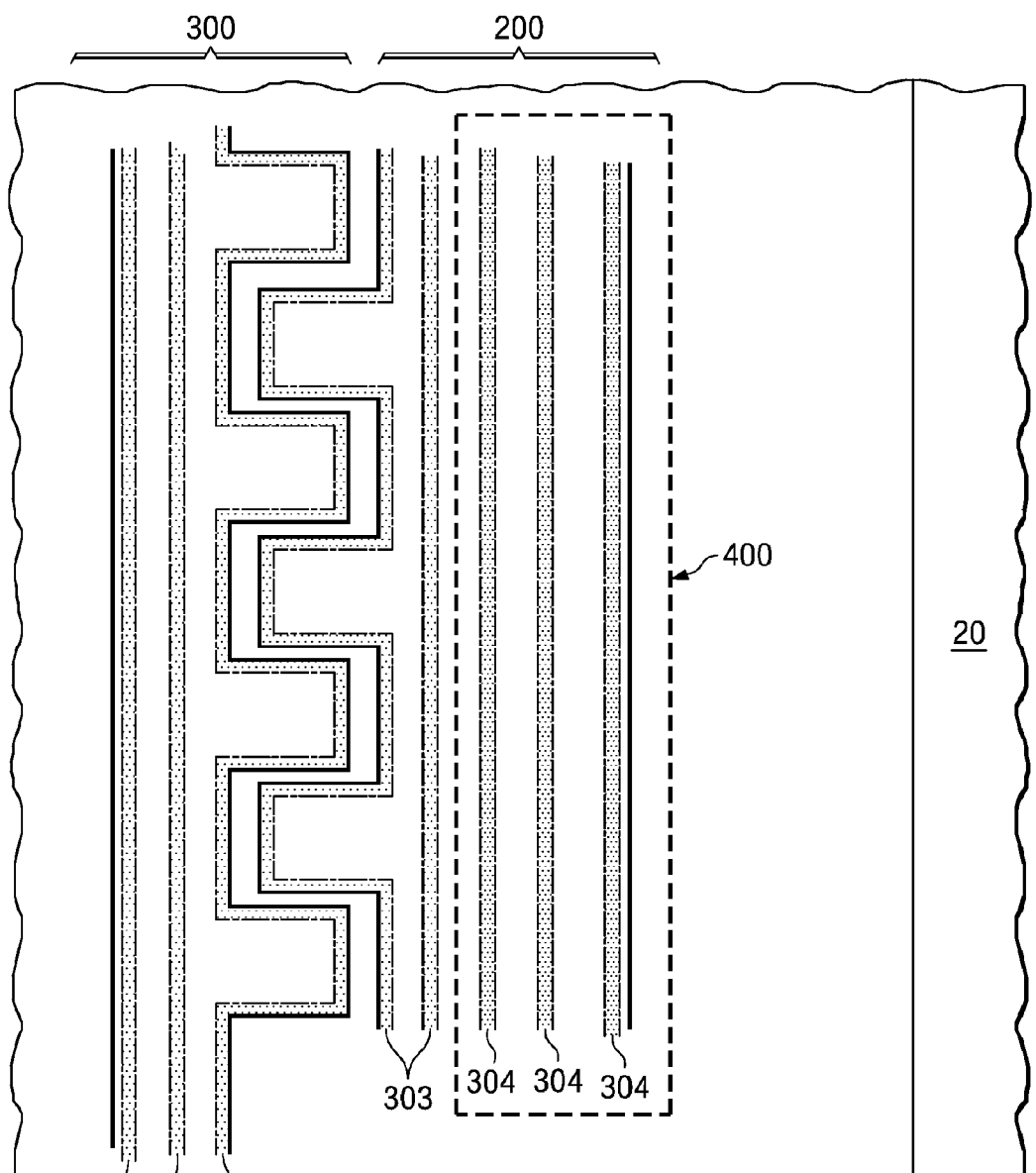

Referring first to FIG. 3a, the outer capacitor plate 200 and the inner capacitor plate 300 may be staggered in a finger like structure to increase the capacitance between the two lines. Similarly, as illustrated in different embodiments in FIG. 3b, the outer capacitor plate 200 and the inner capacitor plate 300 may comprise suitable shapes and patterns to increase the capacitance between the two plates. Referring to FIG. 3b, the outer capacitor plate 200 and the inner capacitor plate 300 are illustrated along with the uninterrupted lines 303. In various embodiments, the uninterrupted lines 303 and the uninterrupted peripheral lines 304 comprising the vias and metal lines in multiple metal and via level are uninterrupted both along the periphery of the chip as well as vertically. Although, in some embodiments only the uninterrupted peripheral lines 304 disposed in the moisture barrier 400 are uninterrupted.

Figure 4:
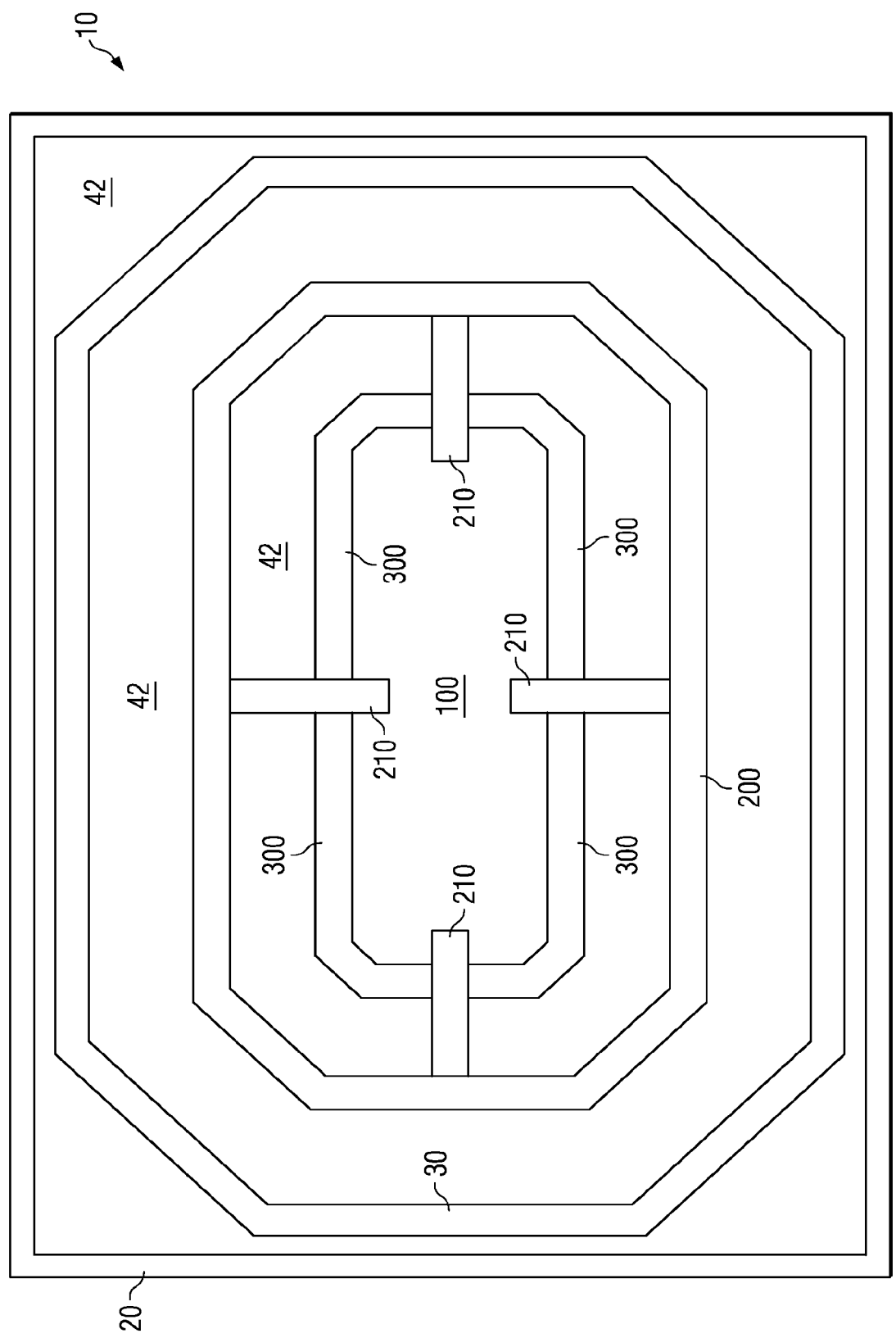
FIG. 4 illustrates top views of the chip illustrating structural embodiments of a moisture barrier capacitor.

FIG. 4 illustrates structural embodiments of the moisture barrier capacitor. Referring to FIG. 4, the edges of the outer capacitor plate 200 and the inner capacitor plate 300 is chamfered to eliminate high stress regions formed by perpendicularly intersecting metal lines. The chamfered edges may be planar, formed by the intersection of metal lines or vias oriented at about 45° to each other as illustrated in FIG. 4. In some embodiments, the chamfered edges may be smooth (unlike angular as in FIG. 4). Although not illustrated some embodiments may use a fillet to strengthen the edges comprising the intersecting metal lines. In other embodiments, the whole peripheral region or the whole chip may be designed in a curvilinear manner. This may be performed to minimize, for example, stress related failure mechanisms.

Figure 5:
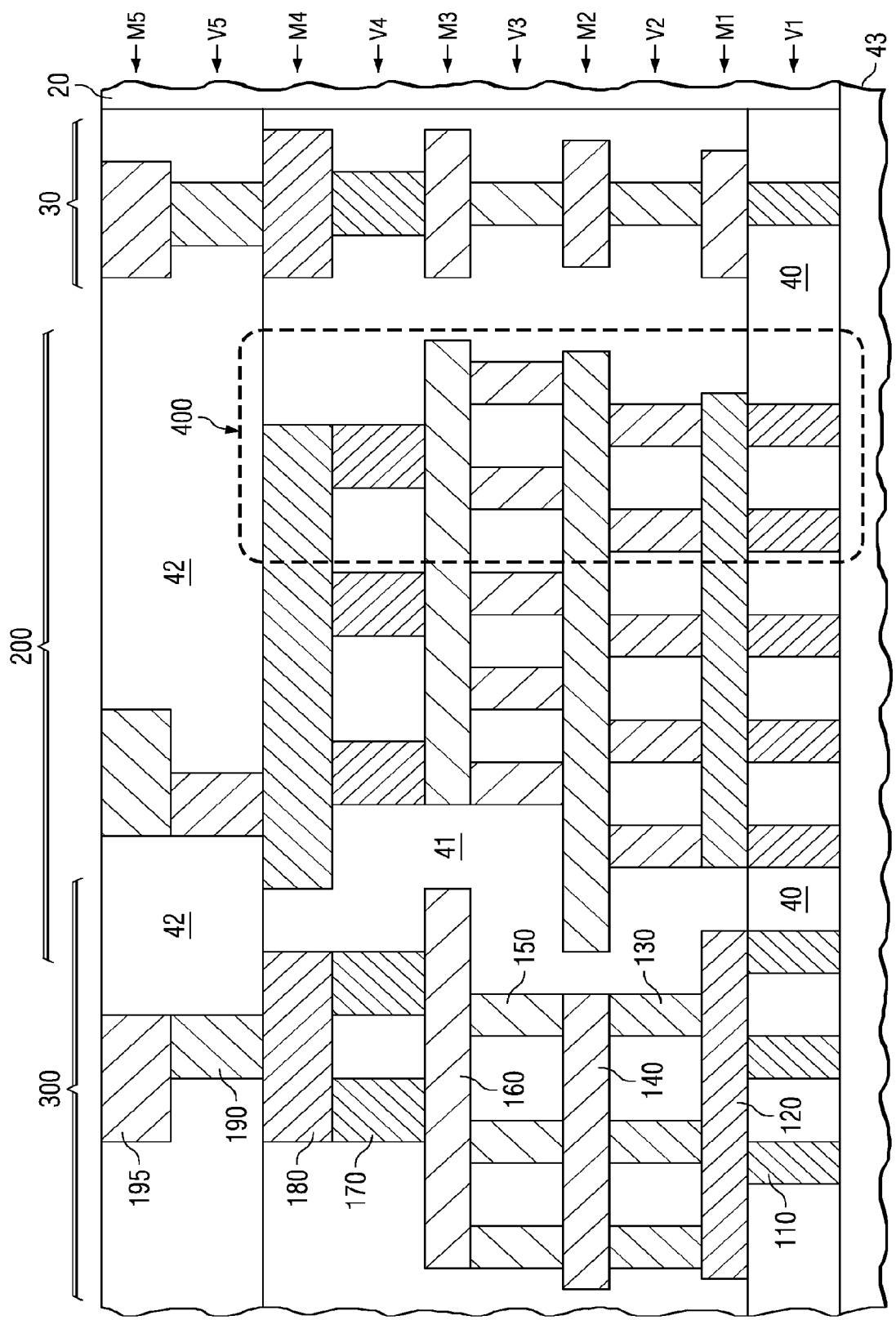
FIG. 5 illustrates a magnified cross section of a portion of a moisture barrier capacitor, in accordance with an embodiment of the invention.

An embodiment of the invention describing a vertical cross section of the chip is illustrated in FIG. 5. In FIG. 5, the design of the metal lines is optimized to increase the parasitic capacitance between an outer capacitor plate 200 and an inner capacitor plate 300. For example, in FIG. 5, a first metal line 120 of the inner capacitor plate 300 capacitively couples laterally to both a first metal line 120 of the outer capacitor plate 200 and vertically to a second metal line 140 of the outer capacitor plate 200.

Figure 6A:
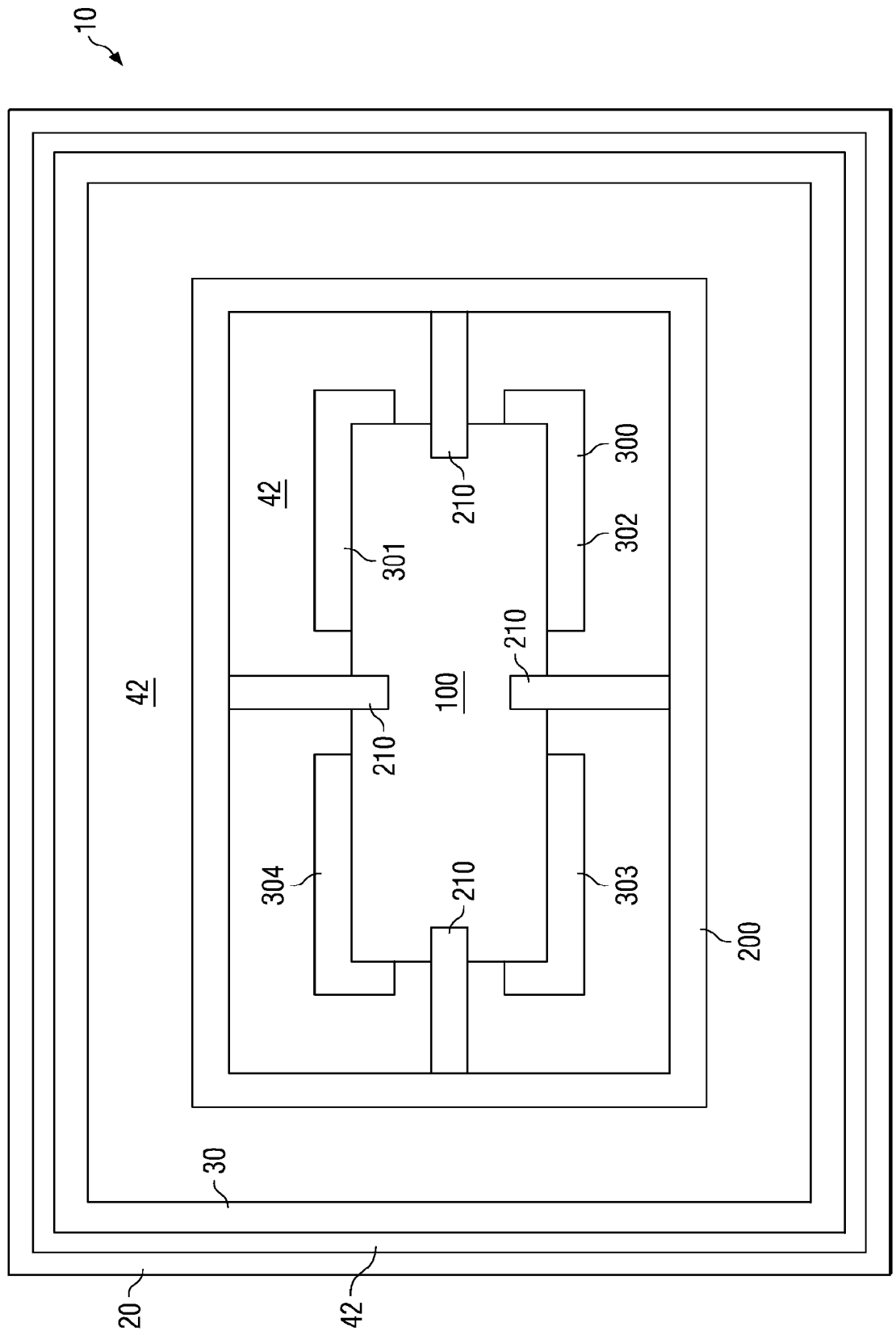
FIGS. 6a-6c, illustrates moisture barrier capacitors in various embodiments of the invention.
Figure 6B:
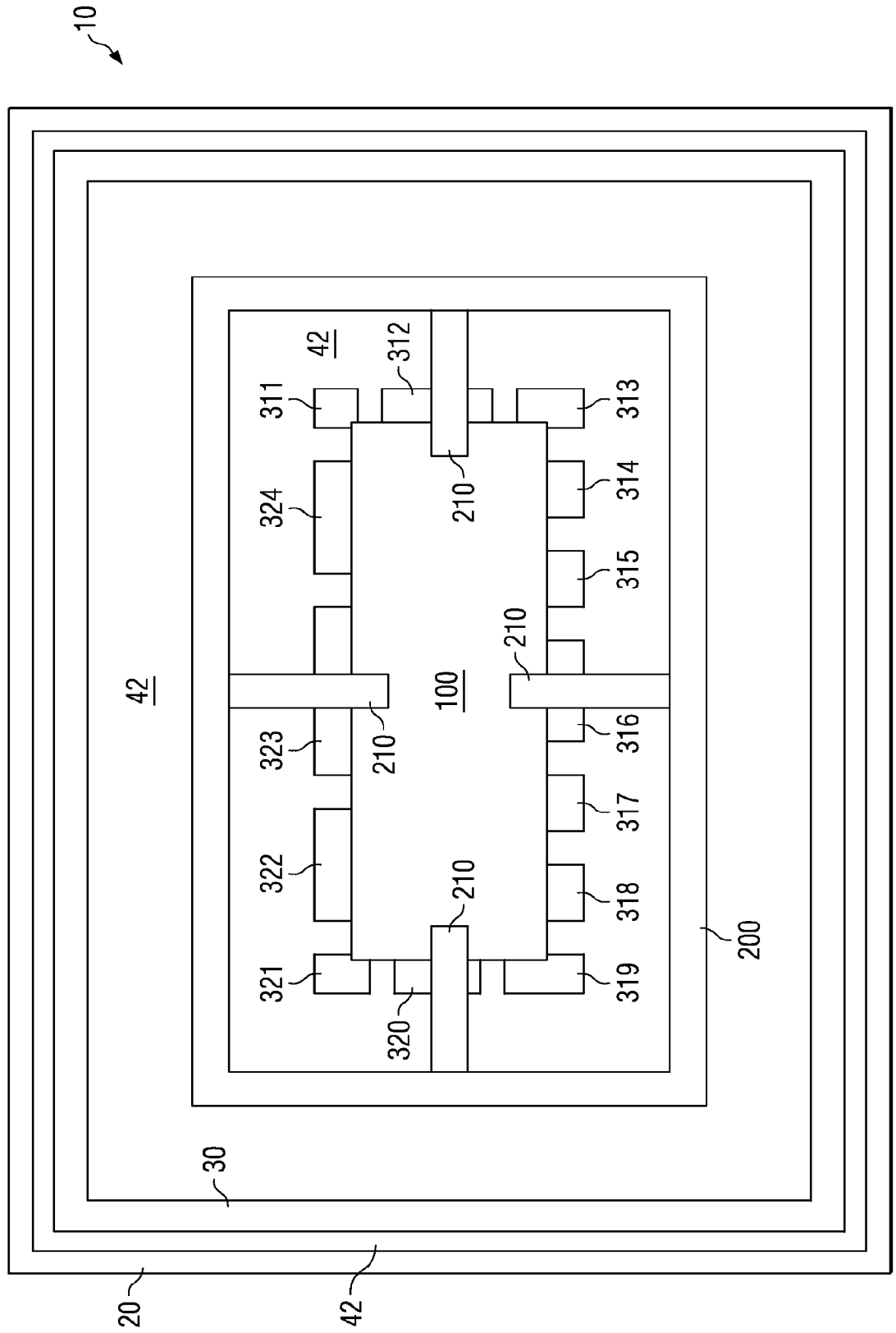
Figure 6C:
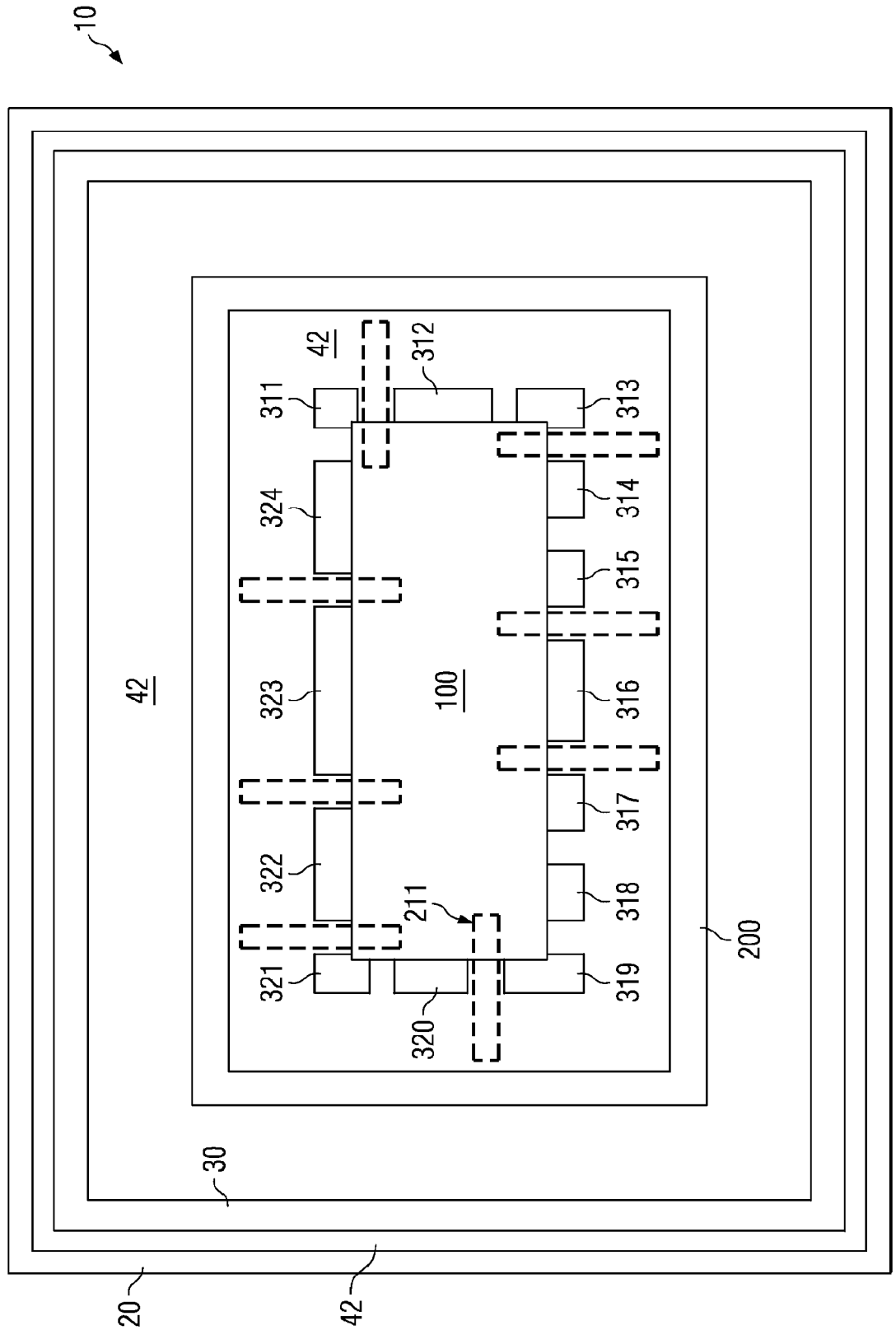

FIG. 6 illustrates embodiments of the invention describing smaller capacitors. In the embodiment described in FIG. 1, the capacitor is one single large capacitor. However, a number of smaller capacitors may be fabricated by separating the inner capacitor plate 200 into a number of smaller discontinuous lines. This is possible because unlike the outer capacitor plate, the inner capacitor plate does not need to be continuous. For example, in FIG. 6a, the inner capacitor plate 200 (e.g., in FIG. 1a) is divided into inner capacitor plates 301-304. The outer capacitor plate may still be a single continuous plate and grounded. Each capacitor plate of the inner capacitor plates 301-304 may be connected to different nodes or circuit blocks and independently controlled by the active circuitry. Similarly, in FIG. 6b, small inner capacitor plates 311-324 are formed by dividing the inner capacitor plate 200 (e.g., in FIG. 1a). Each capacitor plate of the small inner capacitor plates 311-324 may comprise difference capacitance as needed by the active circuitry. In embodiments with individual inner capacitor plates (e.g., small inner capacitor plates 311-324 in FIG. 6b), the outer capacitor plates 200 do not require fins 210. In such embodiments, the outer capacitor plates 200 may be connected via the lower level metal lines 211 in between the spacings of the inner plates. These connections may be embedded in the low-k regions as well, and may be part of any of the lower metal levels. As an example in FIG. 6c, the lower level metal lines 211 are formed in between the small inner capacitor plates 311-324.

A method of forming the moisture barrier capacitor is illustrated in FIG. 7 and flow charts of FIG. 8, in accordance with embodiments of the invention.

In various embodiments of the invention, the metal and via levels are formed using a single damascene process or a dual damascene process. In a single damascene process, a single layer of insulating material is patterned with a pattern for conductive features, such as conductive lines, conductive vias. In contrast, in a dual damascene process, the vias and metals lines are patterned for conductive features and filled in a single fill step with a conductive material.

Figure 8A:
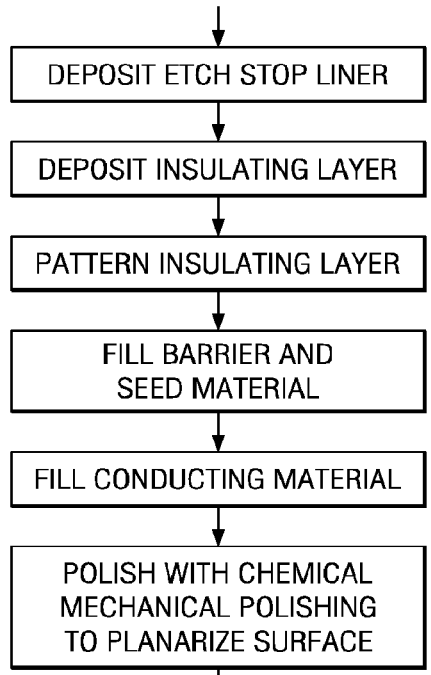
FIGS. 8a and 8b, illustrates flow charts for formation of a metal and/or a via level of the moisture barrier capacitor, in accordance with embodiments of the invention.

A flow chart illustrating formation of a single metal or via level using a single damascene process is illustrated in FIG. 8a. If a dual damascene process is used, a process as illustrated in flow chart in FIG. 8b is used.

Figure 7C:
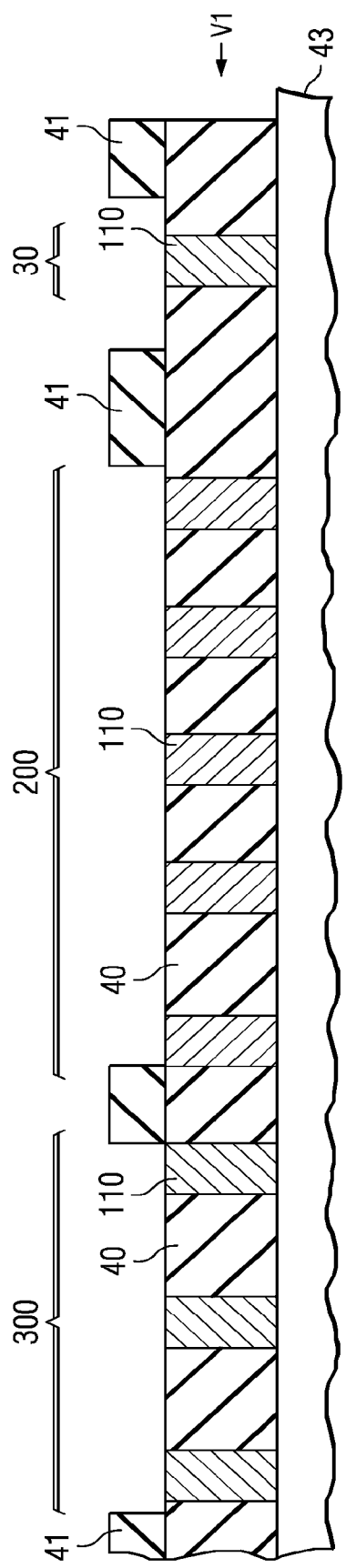
Figure 7D:
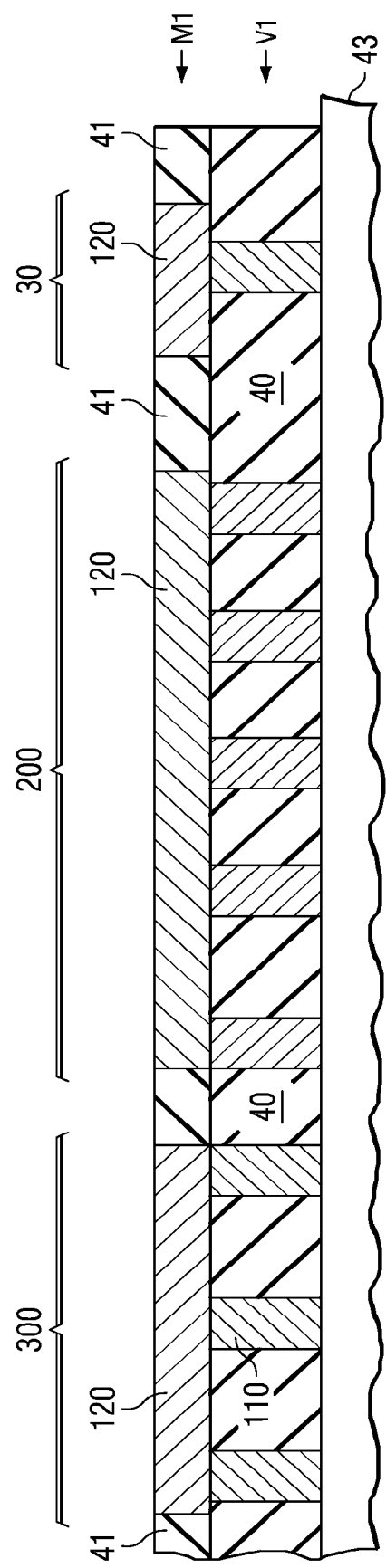
Figure 7E:
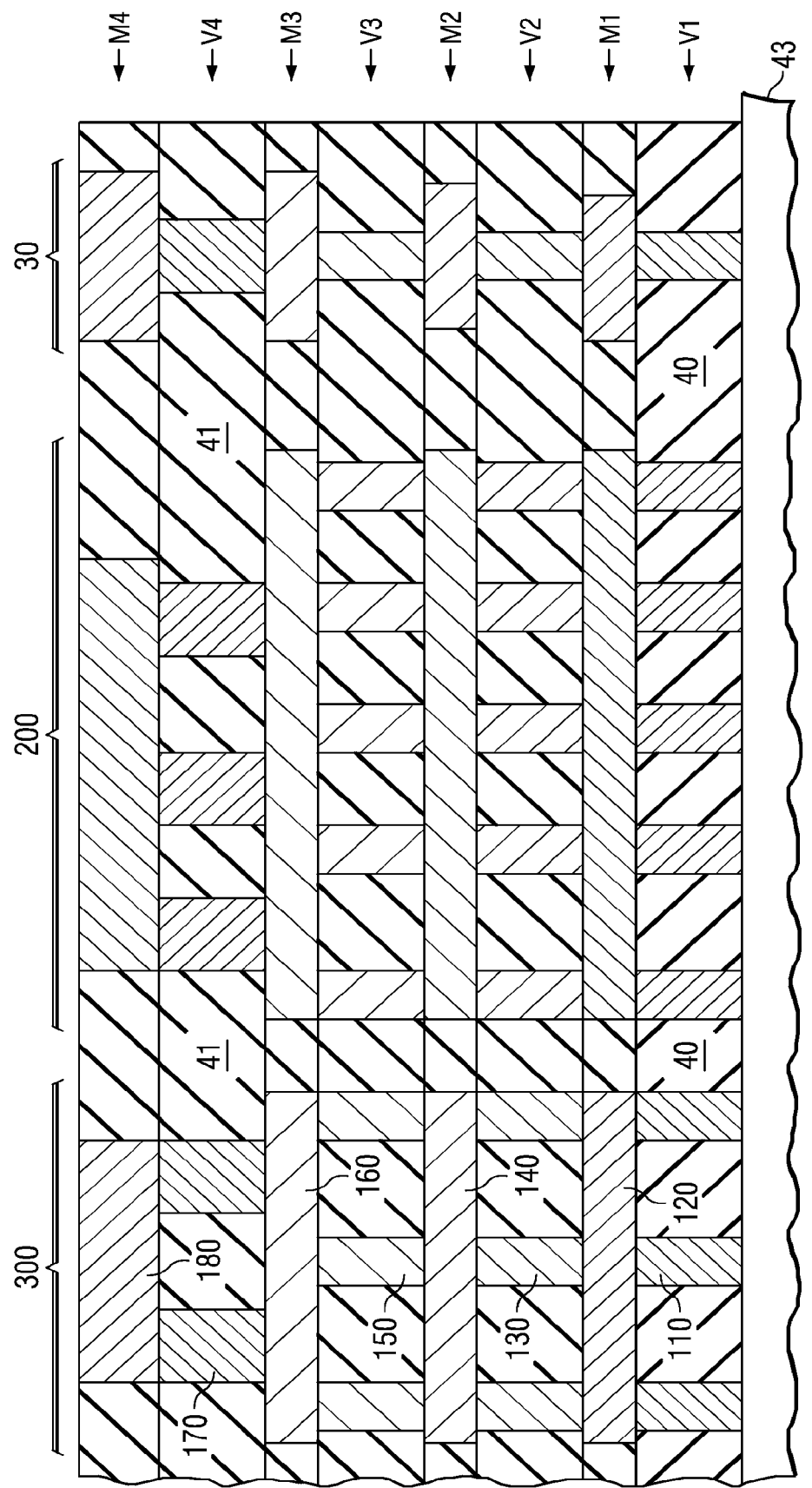

An example of this process using the single damascene process (FIG. 8a) is illustrated in FIGS. 7a-7d for the formation of the first vias 110 in the first via level $V_1$. Referring to FIG. 7a, an insulating layer is deposited over an etch stop liner. The insulating layer is patterned using lithography. The mask used during this lithography step is not an additional, but is common to the metallization level for the active circuitry. FIG. 7a illustrates a patterned first insulating layer 40 and FIG. 7b illustrates this layer after via formation (via fill and planarization). The first metal level $M_1$ is formed above the first via level $V_1$. FIG. 7c illustrates the formation of the metal one pattern and FIG. 7d illustrates the structure after filling of metal and subsequent planarization such as CMP, forming first metal line 120. An additional barrier layer (to prevent metal diffusion) and seed layer for electroplating are deposited before the filling of metal. Subsequent metal and via levels are formed in a similar manner. Metal level $M_2$, $M_3$, $M_4$ and via levels $V_2$, $V_3$ and $V_4$ are illustrated in FIG. 7e.

Figure 7F:
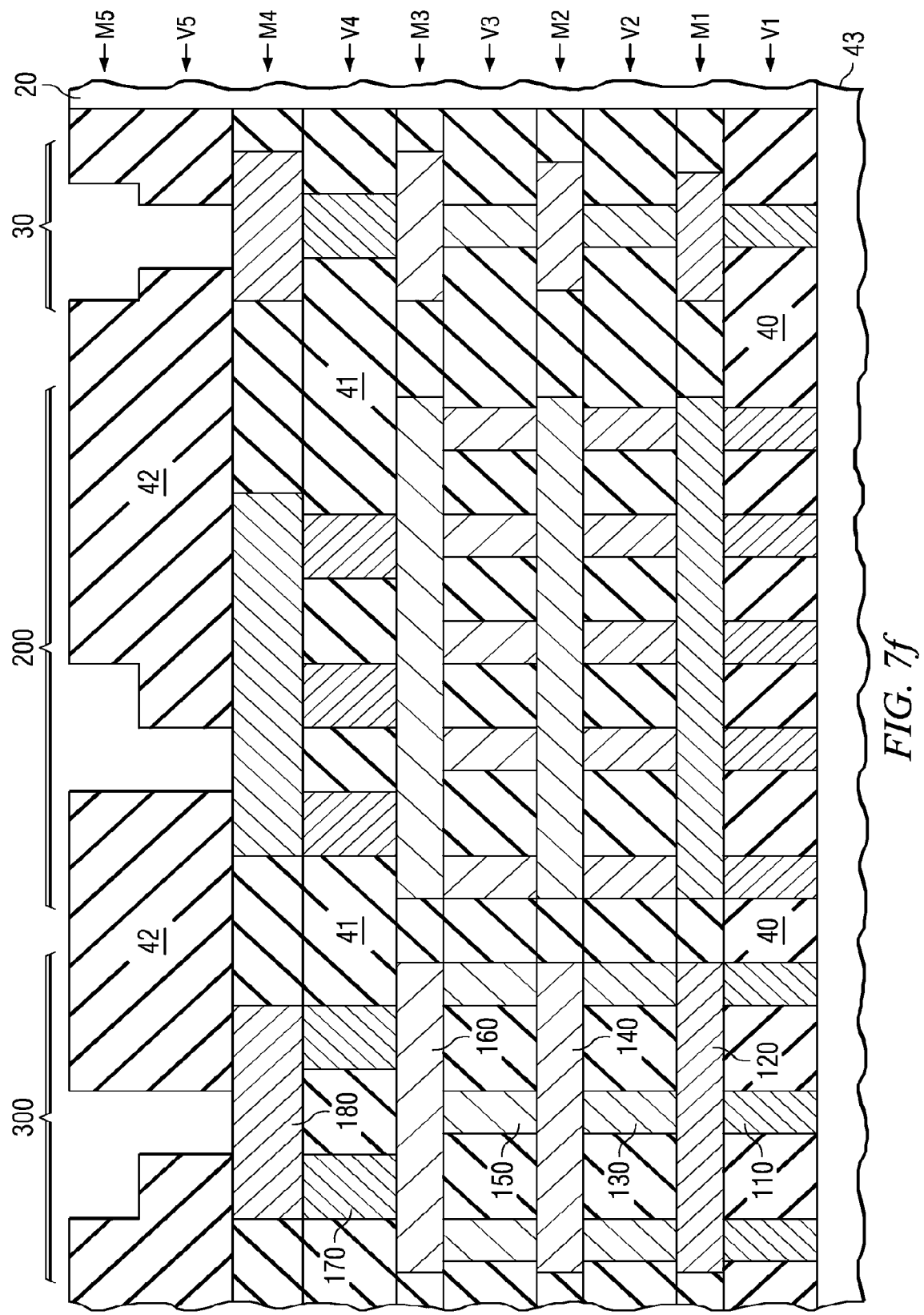
Figure 7G:
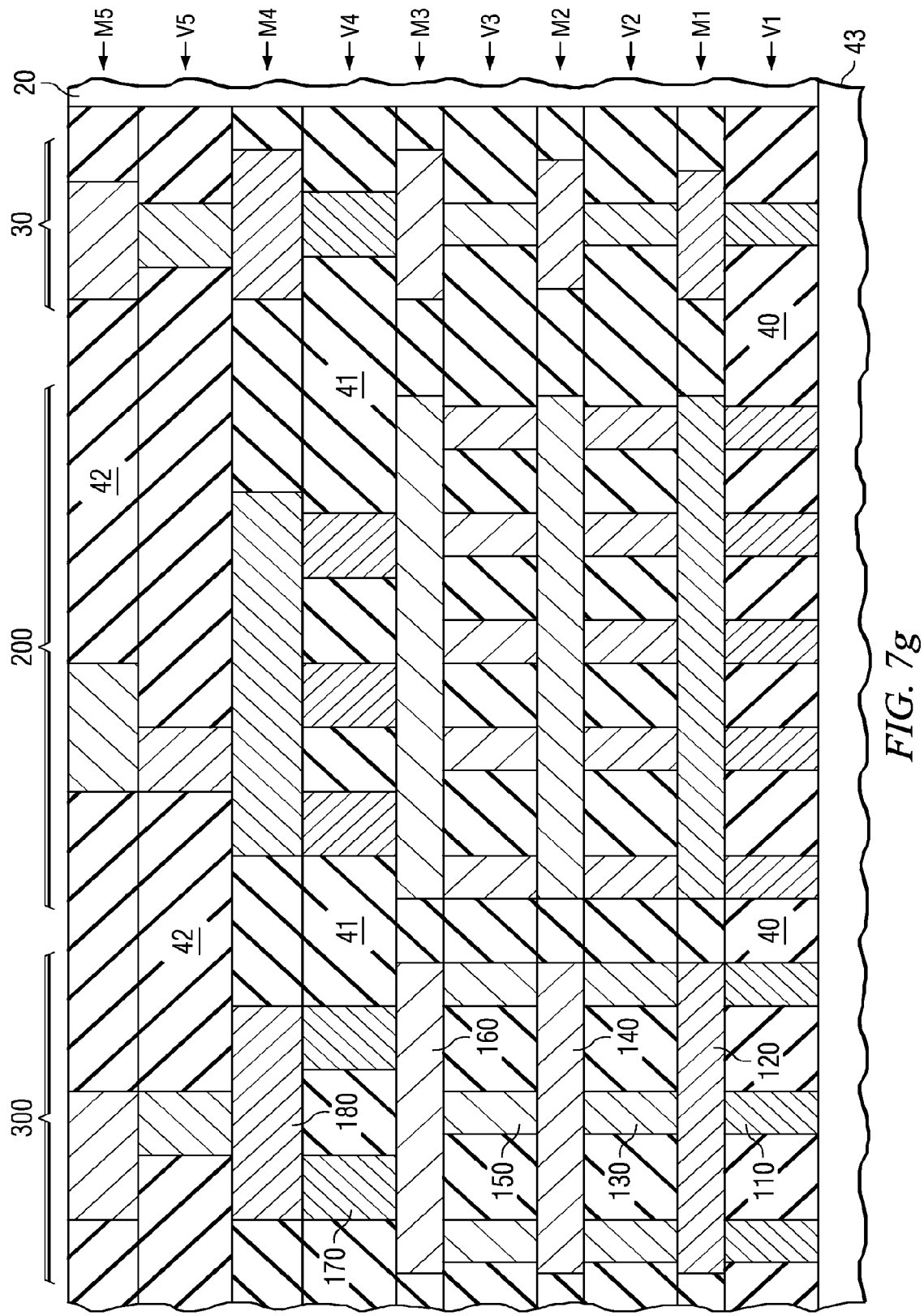
Figure 8B:
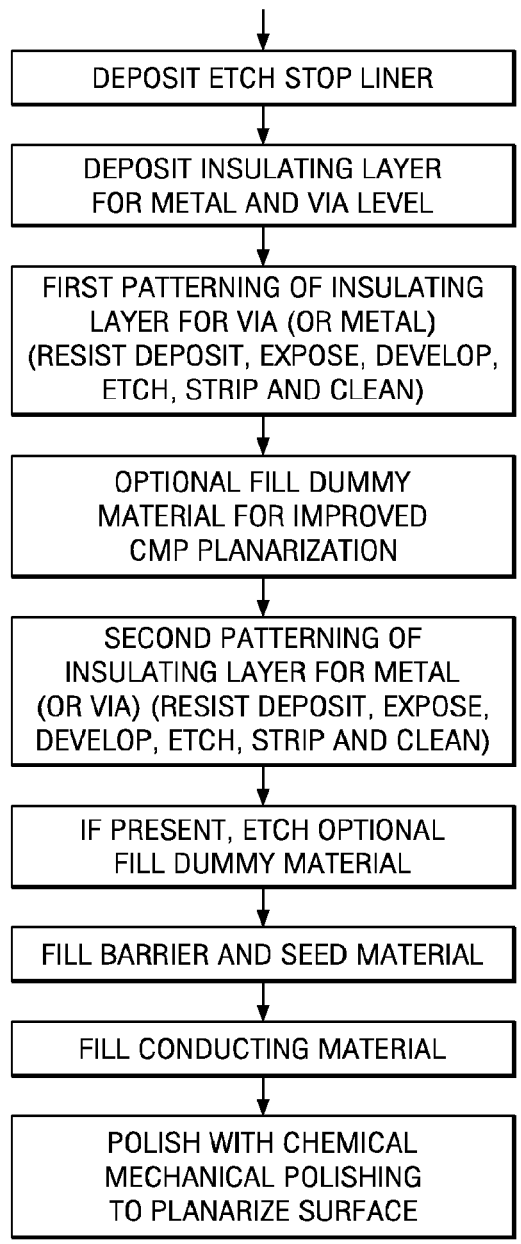

FIG. 7f-7g illustrates the formation of the last level of metallization using a dual damascene process (FIG. 8b). A typical fabrication process may use single or dual damascene processes or combinations thereof in building a multitude of metal and via levels. FIG. 7f illustrates the patterned vias and metal lines of the top most metal level after a typical dual damascene patterning sequence. A conductive metal is electroplated to overfill the aperture. The overfilled conductive metal is polished using chemical mechanical polishing (FIG. 7g). A passivation layer (not shown) is deposited after the metallization layers. Note that the fins 210 illustrated in FIG. 1a are formed in this step (fifth metal level $V_5$) and do not require an independent mask step.

FIG. 9, which includes FIGS. 9a-9d, illustrates another embodiment of the invention and illustrates the moisture barrier capacitor in various stages of the manufacturing. In this embodiment, additional mask steps are used to improve the capacitance of the parasitic capacitor. FIG. 10 illustrates a particular embodiment of the process described in FIG. 9, wherein only some regions of the capacitor are modified. In this embodiment, at least some of the low-k dielectric is replaced with a higher-k dielectric. This higher-k dielectric in various embodiments may comprise silicon oxide ($SiO_2$), silicon nitride ($Si_3N_5$), silicon carbide (SiC), silicon carbon nitride (SiCN), aluminum oxide ($Al_2O_3$), tantalum oxide ($Ta_2O_5$), hafnium oxide ($HfO_2$), hafnium silicon oxide (HfSiO), hafnium oxynitride (HfSiON), zirconium oxide ($ZrO_2$), zirconium silicon oxide (ZrSiO), titanium oxide ($TiO_2$), barium strontium titanate (BST), strontium bismuth tantalate (SBT), lead zirconium titanate (PZT), lead magnesium niobate (PMN) or any other higher-k or high-k material or any combination thereof. Hence, all the metal and via levels containing the low-k dielectric are first fabricated.

Figure 9A:
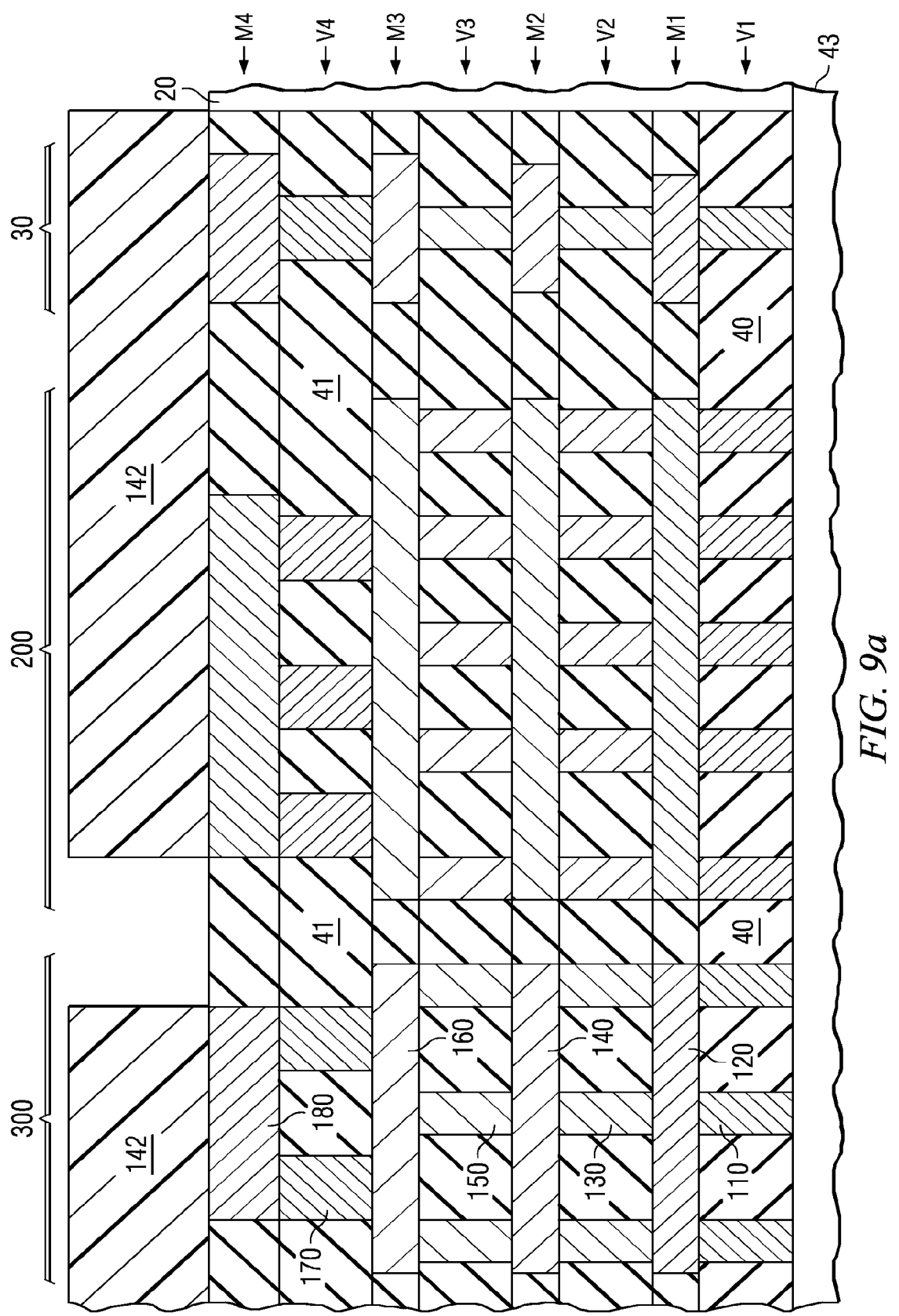
FIGS. 9a-9d, illustrates a method of fabrication of the moisture barrier capacitor in various stages of fabrication, in accordance with embodiments of the invention.
Figure 9B:
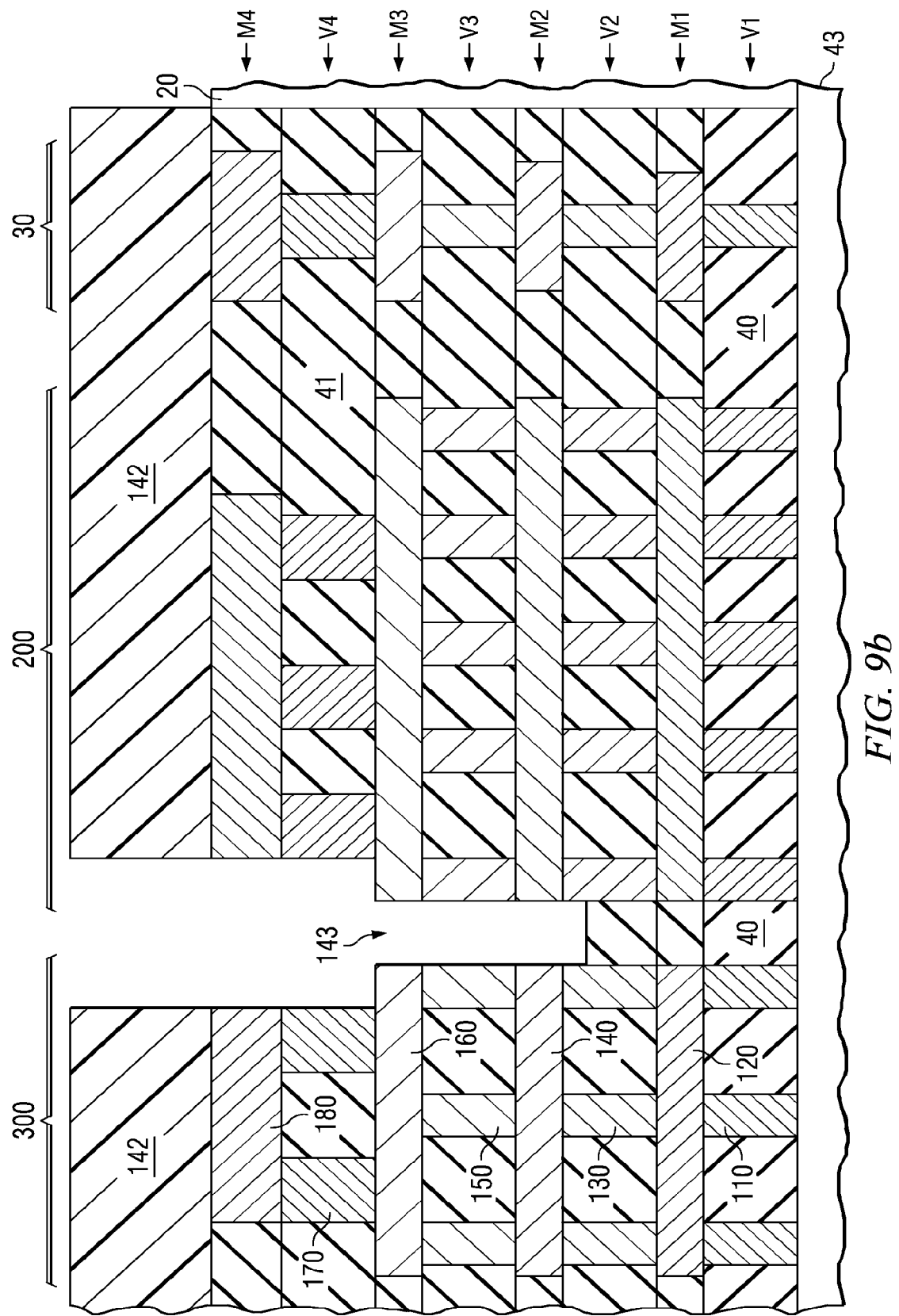
Figure 9C:
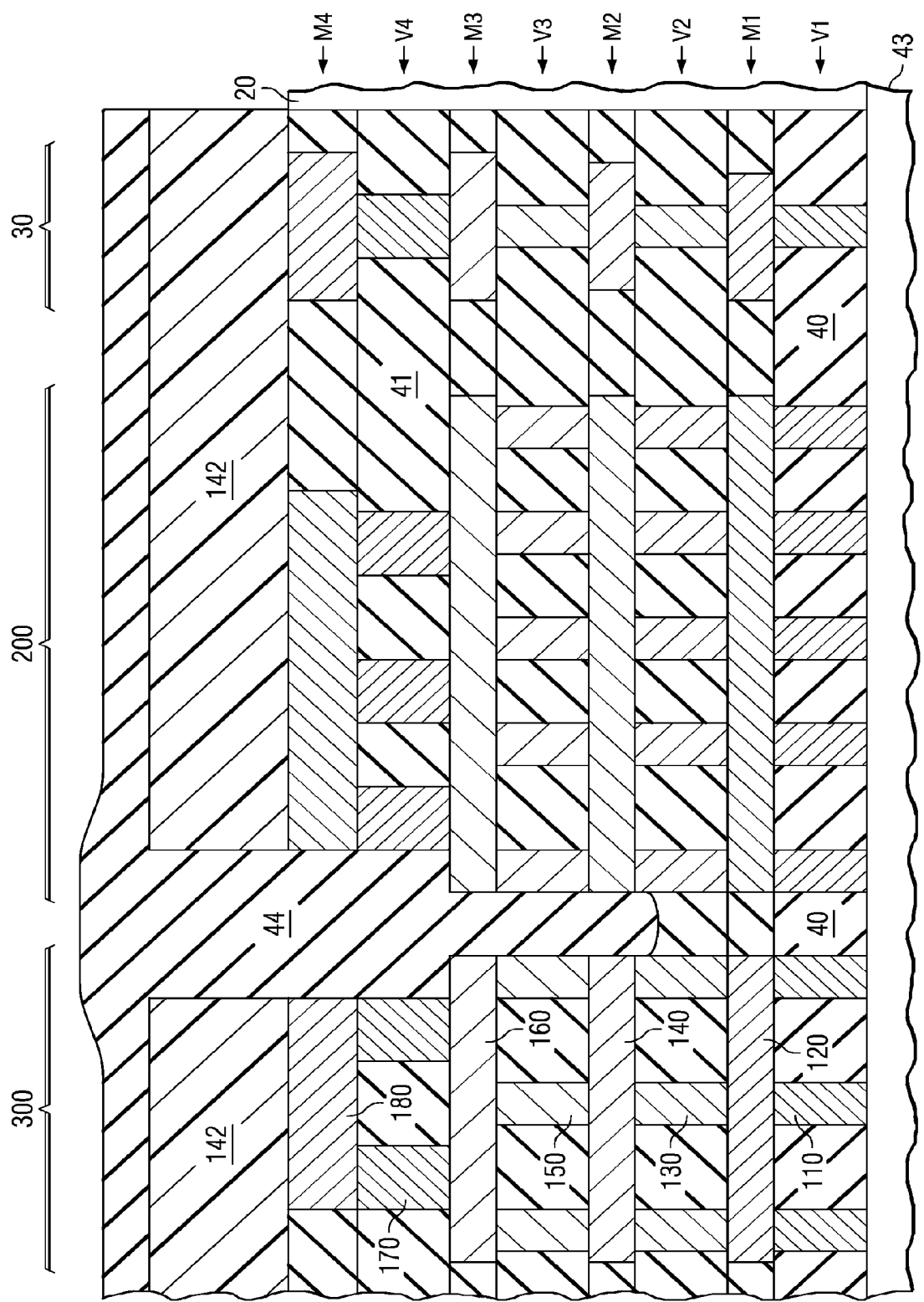
Figure 9D:
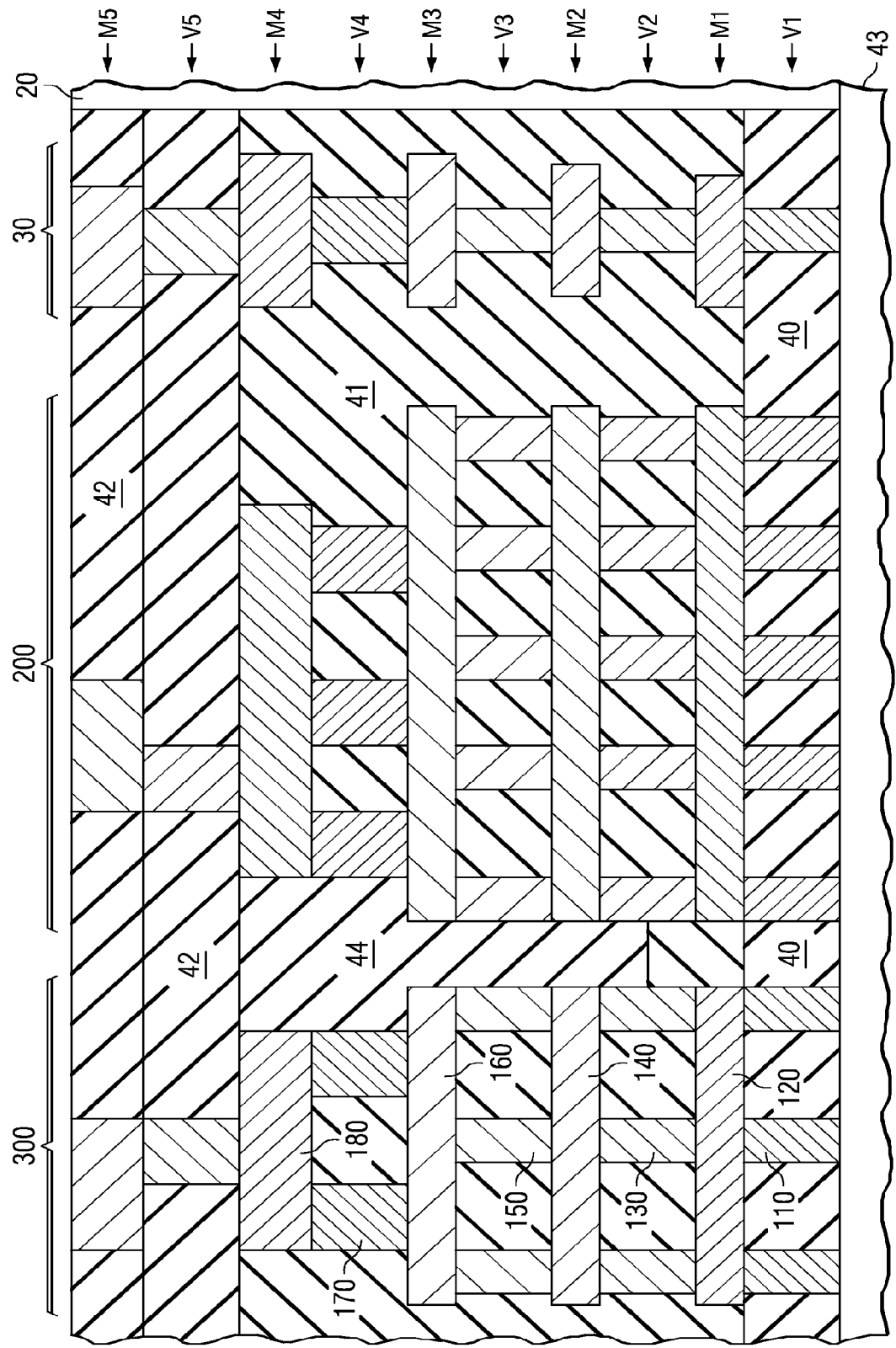
Figure 10:
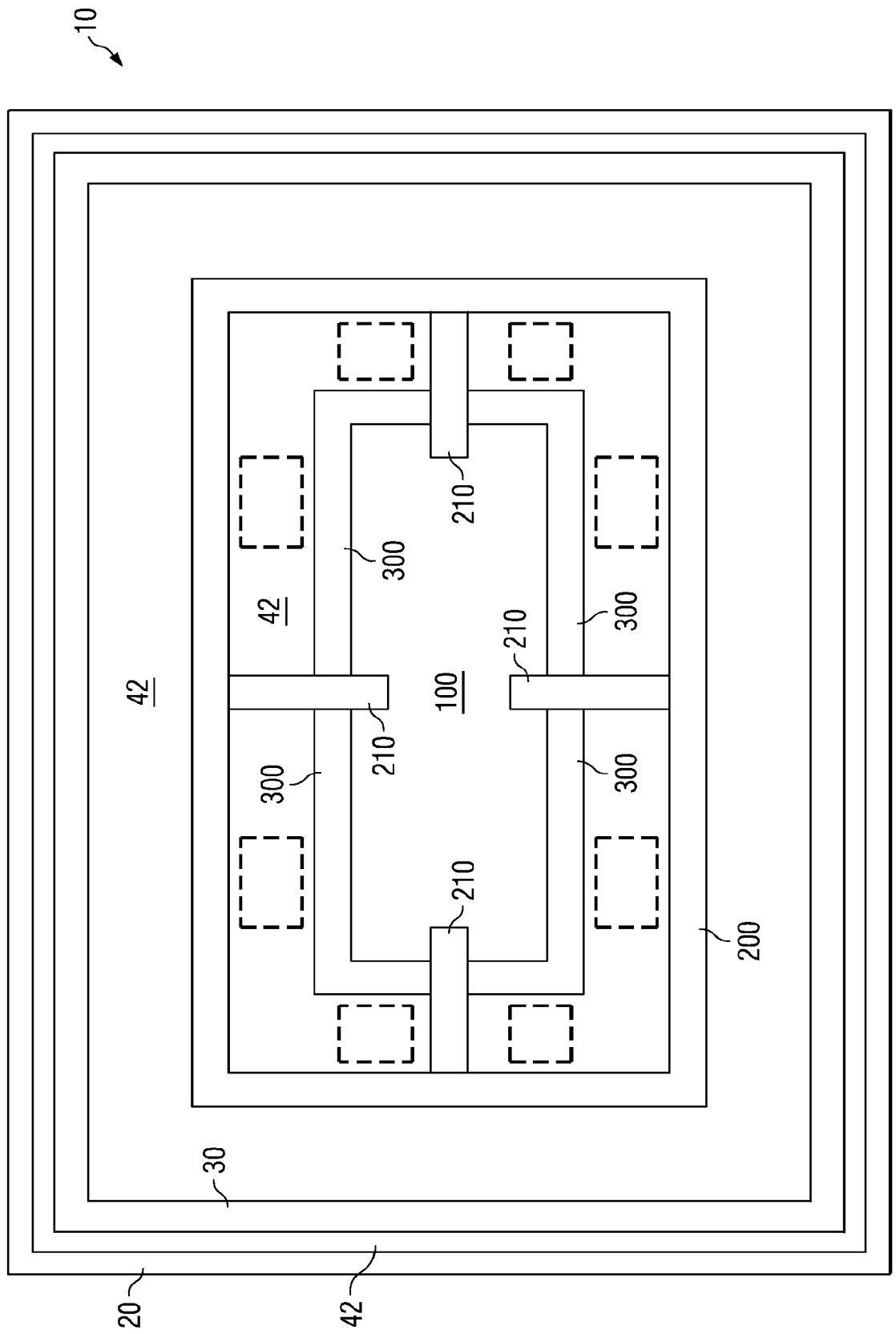
FIG. 10 illustrates an embodiment of the moisture barrier capacitor described in FIG. 9, in accordance with embodiments of the invention.

Referring to FIG. 9a, the process follows the fabrication steps as in FIGS. 7a-7e. In this embodiment, the last metal level containing the low-k dielectric (second insulation layer 41) is metal level $M_4$. A hard mask layer is deposited and patterned using a photoresist. The patterned hard mask 142 exposes the second insulation layer 41 between the outer capacitor plate 200 and the inner capacitor plate 300. A subsequent etch removes the second insulation layer 41 between the outer capacitor plate 200 and the inner capacitor plate 300. To minimize structural issues, the etch may remove only part of the second insulation layer 41. FIG. 9b illustrates the trench 143 formed after the etch. As illustrated in FIG. 9c, a fourth insulation layer 44 is next deposited into the trench 143. The fourth insulation layer 44 is a high-k dielectric selected to maximize the capacitance of the moisture barrier capacitor. The fourth insulation layer 44 preferably comprises an oxide of silicon, although in other embodiments the fourth insulation layer 44 may comprise nitrides, hafnium oxide, aluminum oxide, titanium oxide, tantalum oxide, or other high-k dielectrics and combinations thereof. After filling the trench 143, the excess fourth insulation layer 44 and the hardmask layer 142 are removed by an etch back or by a CMP process. Next, the final via $V_5$ and final metal lines ($M_5$) are fabricated as usual. The moisture barrier capacitor after fabrication of final metal level is illustrated in FIG. 9d.

FIG. 10 illustrates a top view of an embodiment of the method described in FIG. 9. In FIG. 10, the fourth insulation layer 44 is present in only certain regions of the capacitor. This is done to minimize structural or mechanical issues especially in etching the second insulation layer 41 (low-k material layer) to form the trench 143 as shown in FIG. 9b.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a moisture barrier capacitor, the method comprising:
    forming an outer plate and an inner plate of the moisture barrier capacitor, the capacitor disposed on a periphery of a chip edge;
    forming electrical connections to the outer plate of the capacitor to an active circuitry through a upper layer not porous to moisture, wherein the outer plate is electrically connected by fins, wherein at least a portion of the fins are disposed above the inner plate and embedded in the upper layer comprising oxide or nitride region;
    forming electrical connections to the inner plate of the capacitor to the active circuitry; and
    forming a moisture barrier structure in the outer plate of the moisture barrier capacitor.

2. The method of claim 1, wherein the outer plate, the inner plate and the moisture barrier structure are formed as a part of a metallization process, and wherein forming the outer plate, the inner plate, and the moisture barrier structure do not require any additional masks or masking steps than masks needed to form a metallization layer over the active circuitry.

3. The method of claim 1, forming the outer and the inner plate of the parasitic capacitor comprises forming via and metal levels, wherein forming the via and metal levels comprises:
- depositing a dielectric material layer;
- patterning the dielectric material layer forming an aperture;
- depositing a conductive liner on sidewalls and a bottom surface of the aperture;
- filling the aperture with a conductive material after depositing the conductive liner; and
- planarising the conductive material.

4. The method of claim 1, wherein the upper layer is a silicon oxide layer.

5. The method of claim 1, wherein the outer plate and the inner plate do not overlap and are laterally separated.

6. The method of claim 5, wherein the outer plate comprises first vias adjacent a first edge of the outer plate and second vias adjacent an opposite second edge of the outer plate, the second vias being conductively coupled to the first vias.

7. The method of claim 6, wherein only the first vias are substantially capacitively coupled to the inner plate.

8. The method of claim 1, wherein a portion of the inner plate and the outer plate are separated by an insulating material, wherein the insulating material is not a low-k dielectric material, and wherein a corresponding portion between the outer plate and the chip edge is separated by a low-k insulating material.

9. The method of claim 1, wherein the outer plate comprises a moisture barrier.

10. The method of claim 9, wherein the moisture barrier comprises additional vias and additional length and width of metal lines, and wherein each of the inner plate and outer plate comprises vertically stacked metal lines and vias.

11. The method of claim 10, wherein at least a portion of the vertically stacked metal lines and the vias are disposed in a low-k insulating material.

12. The method of claim 1, and wherein the outer plate extends vertically without disruption in a low-k insulating material.

13. A method of forming a moisture barrier capacitor, the method comprising:
- forming an outer plate and an inner plate of the moisture barrier capacitor, the capacitor disposed on a periphery of a chip edge;
- forming electrical connections to the outer plate of the capacitor to an active circuitry through a upper layer not porous to moisture;
- forming electrical connections to the inner plate of the capacitor to the active circuitry, wherein a portion of the inner plate and the outer plate are separated by an insulating material, wherein the insulating material is not a low-k dielectric material, and wherein a corresponding portion between the outer plate and the chip edge is separated by a low-k insulating material;
- forming a moisture barrier structure in the outer plate of the moisture barrier capacitor.

14. The method of claim 13, wherein the outer plate, the inner plate and the moisture barrier structure are formed as a part of a metallization process, and wherein forming the outer plate, the inner plate, and the moisture barrier structure do not require any additional masks or masking steps than masks needed to form a metallization layer over the active circuitry.

15. The method of claim 13, forming the outer and the inner plate of the parasitic capacitor comprises forming via and metal levels, wherein forming the via and metal levels comprises:
- depositing a dielectric material layer;
- patterning the dielectric material layer forming an aperture;
- depositing a conductive liner on sidewalls and a bottom surface of the aperture;
- filling the aperture with a conductive material after depositing the conductive liner; and
- planarising the conductive material.

16. The method of claim 13, wherein the upper layer is a silicon oxide layer.

17. The method of claim 13, wherein the outer plate and the inner plate do not overlap and are laterally separated.

18. The method of claim 17, wherein the outer plate comprises first vias adjacent a first edge of the outer plate and second vias adjacent an opposite second edge of the outer plate, the second vias being conductively coupled to the first vias.

19. The method of claim 18, wherein only the first vias are substantially capacitively coupled to the inner plate.

20. The method of claim 13, wherein the outer plate comprises a moisture barrier.

21. The method of claim 20, wherein the moisture barrier comprises additional vias and additional length and width of metal lines, and wherein each of the inner plate and outer plate comprises vertically stacked metal lines and vias.

22. The method of claim 21, wherein at least a portion of the vertically stacked metal lines and the vias are disposed in a low-k insulating material.

23. The method of claim 13, wherein the outer plate is electrically connected by fins, wherein at least a portion of the fins are disposed above the inner plate and embedded in the upper layer comprising oxide or nitride region, and wherein the outer plate extends vertically without disruption in a low-k insulating material.

\* \* \* \* \*